(12) United States Patent
Breymesser et al.

(10) Patent No.: US 9,385,075 B2
(45) Date of Patent: Jul. 5, 2016

(54) GLASS CARRIER WITH EMBEDDED SEMICONDUCTOR DEVICE AND METAL LAYERS ON THE TOP SURFACE

(71) Applicant: Infineon Technologies AG, Neubiberg (DE)

(72) Inventors: Alexander Breymesser, Villach (AT); Andre Brockmeier, Villach (AT); Franz Dielacher, Villach (AT); Francisco Javier Santos Rodriguez, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/661,923

(22) Filed: Oct. 26, 2012

(65) Prior Publication Data

US 2014/0117530 A1    May 1, 2014

(51) Int. Cl.
*H01L 23/29* (2006.01)
*H01L 23/498* (2006.01)
(Continued)

(52) U.S. Cl.
CPC ........ *H01L 23/49822* (2013.01); *H01L 21/565* (2013.01); *H01L 21/568* (2013.01); *H01L 23/291* (2013.01); *H01L 23/3114* (2013.01); *H01L 23/5389* (2013.01); *H01L 24/19* (2013.01); *H01L 24/96* (2013.01); *H01L 24/03* (2013.01); *H01L 24/05* (2013.01); *H01L 24/11* (2013.01); *H01L 24/13* (2013.01); *H01L 2224/024* (2013.01); *H01L 2224/0239* (2013.01); *H01L 2224/0345* (2013.01); *H01L 2224/03464* (2013.01); *H01L 2224/0401* (2013.01); *H01L 2224/04105* (2013.01); *H01L 2224/0568* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05672* (2013.01); *H01L 2224/1132* (2013.01); *H01L 2224/11334* (2013.01); *H01L 2224/12105* (2013.01); *H01L 2224/13022* (2013.01); *H01L 2224/13024* (2013.01);
(Continued)

(58) Field of Classification Search
CPC ................ H01L 2224/32225; H01L 23/49822
USPC .................. 257/778, 734, E21.502, E23.118; 438/127
See application file for complete search history.

(56) References Cited

U.S. PATENT DOCUMENTS

| | | |
|---|---|---|
| 3,325,586 A | 6/1967 | Suddick |
| 3,493,405 A | 2/1970 | Thomas |
| 3,639,975 A | 2/1972 | Tefft |
| 4,046,540 A | 9/1977 | Lewis et al. |
| 4,133,690 A | 1/1979 | Muller |
| 4,285,730 A | 8/1981 | Sanford et al. |
| 4,897,509 A | 1/1990 | Holleran et al. |
| 5,086,334 A | 2/1992 | Eberlein |

(Continued)

FOREIGN PATENT DOCUMENTS

| | | | |
|---|---|---|---|
| DE | 10 2010 029 550 A1 | | 12/2011 |
| WO | WO 2011/108227 | * | 9/2011 |

*Primary Examiner* — Peter Bradford
(74) *Attorney, Agent, or Firm* — Slater Matsil, LLP

(57) ABSTRACT

A device includes a semiconductor material having a first main surface, an opposite surface opposite to the first main surface and a side surface extending from the first main surface to the opposite surface. The device further includes a first electrical contact element arranged on the first main surface of the semiconductor material and a glass material. The glass material includes a second main surface wherein the glass material contacts the side surface of the semiconductor material and wherein the first main surface of the semiconductor material and the second main surface of the glass material are arranged in a common plane.

21 Claims, 19 Drawing Sheets

(51) Int. Cl.
*H01L 23/31* (2006.01)
*H01L 21/56* (2006.01)
*H01L 23/538* (2006.01)
*H01L 23/00* (2006.01)

(52) U.S. Cl.
CPC ........ *H01L 2224/13109* (2013.01); *H01L 2224/13111* (2013.01); *H01L 2224/24137* (2013.01); *H01L 2224/24195* (2013.01); *H01L 2224/73267* (2013.01); *H01L 2224/92144* (2013.01); *H01L 2924/10253* (2013.01); *H01L 2924/10271* (2013.01); *H01L 2924/10272* (2013.01); *H01L 2924/10329* (2013.01); *H01L 2924/12042* (2013.01); *H01L 2924/1421* (2013.01); *H01L 2924/1431* (2013.01); *H01L 2924/1434* (2013.01); *H01L 2924/1461* (2013.01); *H01L 2924/18162* (2013.01); *H01L 2924/19104* (2013.01)

(56) References Cited

U.S. PATENT DOCUMENTS

| | | | | |
|---|---|---|---|---|
| 6,690,583 | B1* | 2/2004 | Bergstedt et al. | 361/763 |
| 7,396,754 | B2 | 7/2008 | Chee et al. | |
| 7,429,926 | B1* | 9/2008 | Drimer | 340/572.7 |
| 7,749,810 | B2 | 7/2010 | Yang | |
| 2002/0179914 | A1* | 12/2002 | Sheu | 257/90 |
| 2007/0018333 | A1* | 1/2007 | Tsai et al. | 257/777 |
| 2008/0309836 | A1* | 12/2008 | Sakama et al. | 349/1 |
| 2009/0075425 | A1* | 3/2009 | Hayashi et al. | 438/108 |
| 2009/0315320 | A1* | 12/2009 | Finn | 283/107 |
| 2010/0193928 | A1 | 8/2010 | Zudock et al. | |
| 2011/0291301 | A1* | 12/2011 | Bruendel et al. | 257/783 |
| 2012/0049375 | A1* | 3/2012 | Meyer et al. | 257/773 |
| 2012/0319159 | A1* | 12/2012 | Nakatani et al. | 257/99 |
| 2013/0105999 | A1* | 5/2013 | Ding et al. | 257/794 |

\* cited by examiner

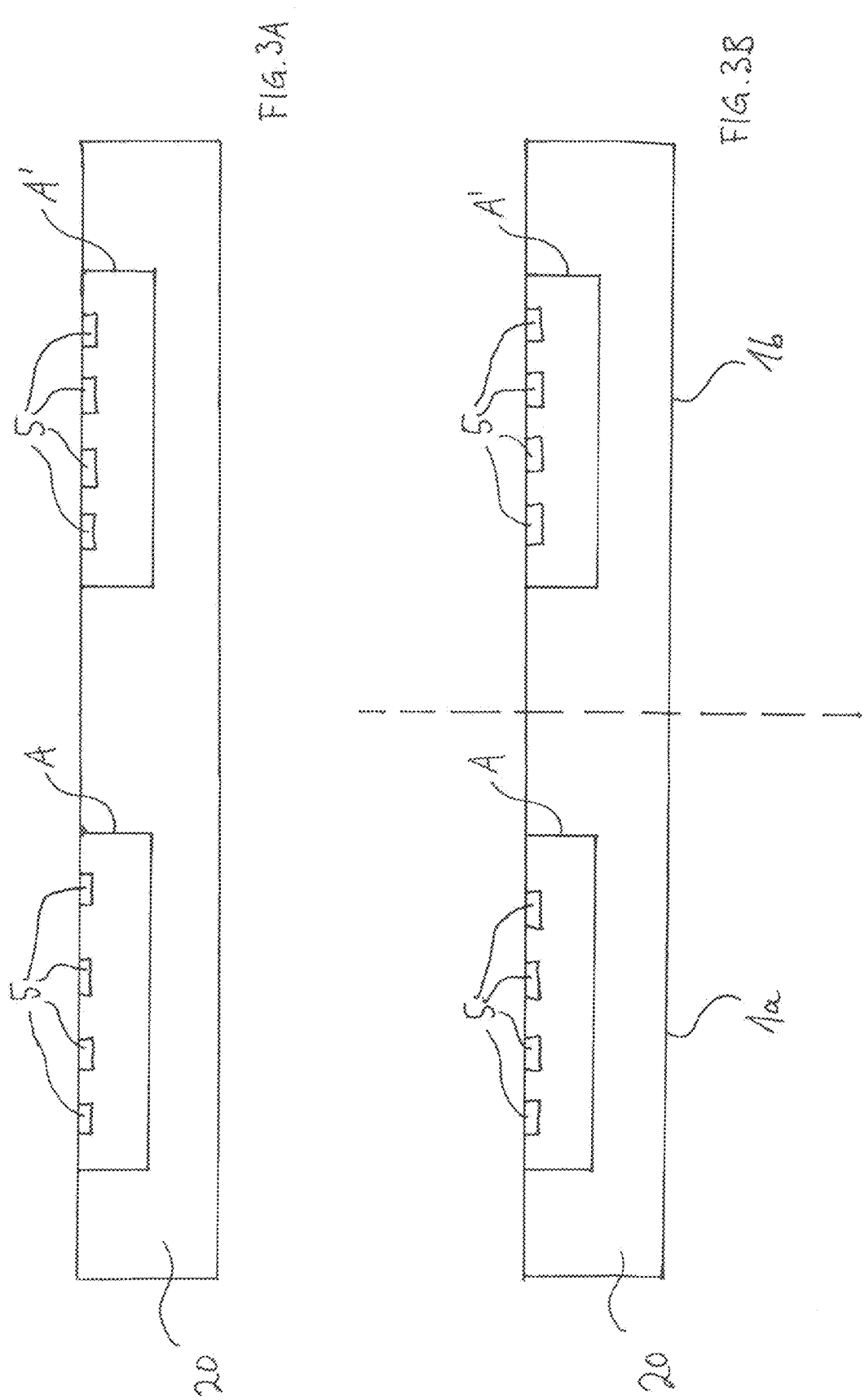

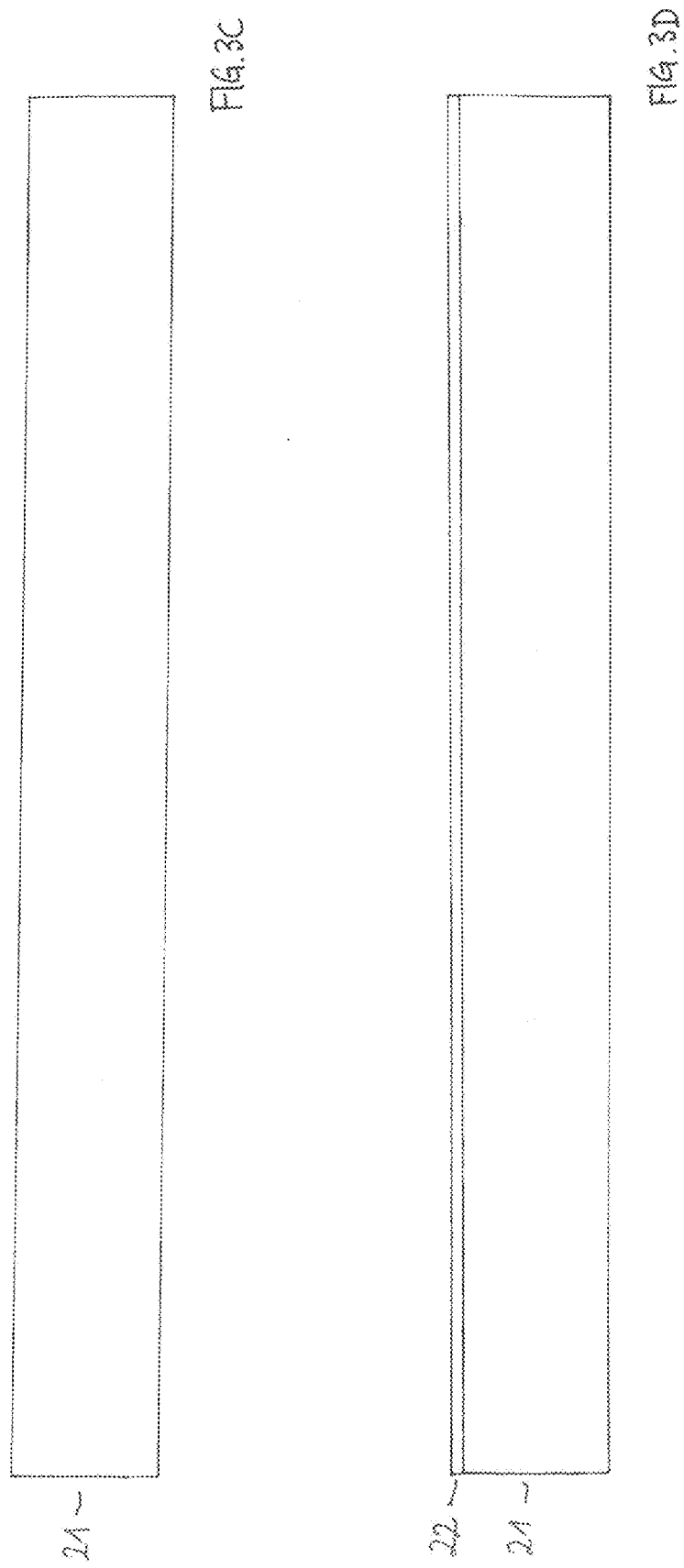

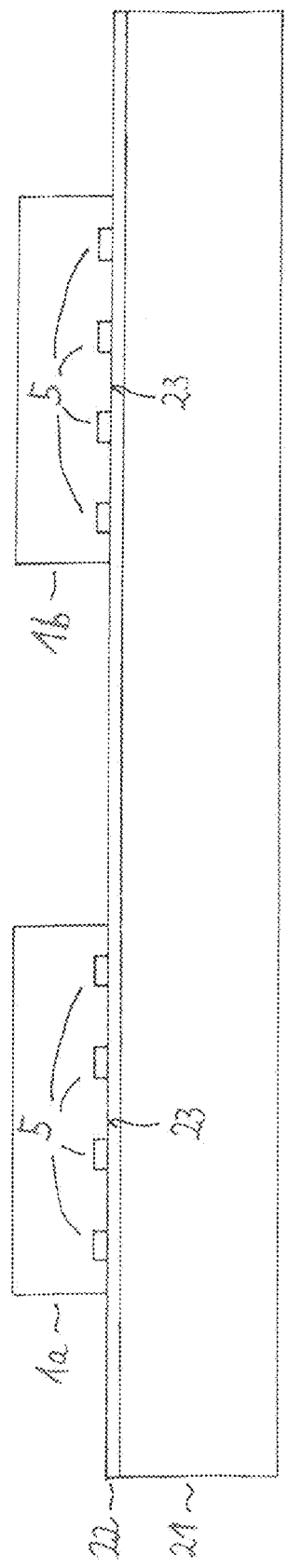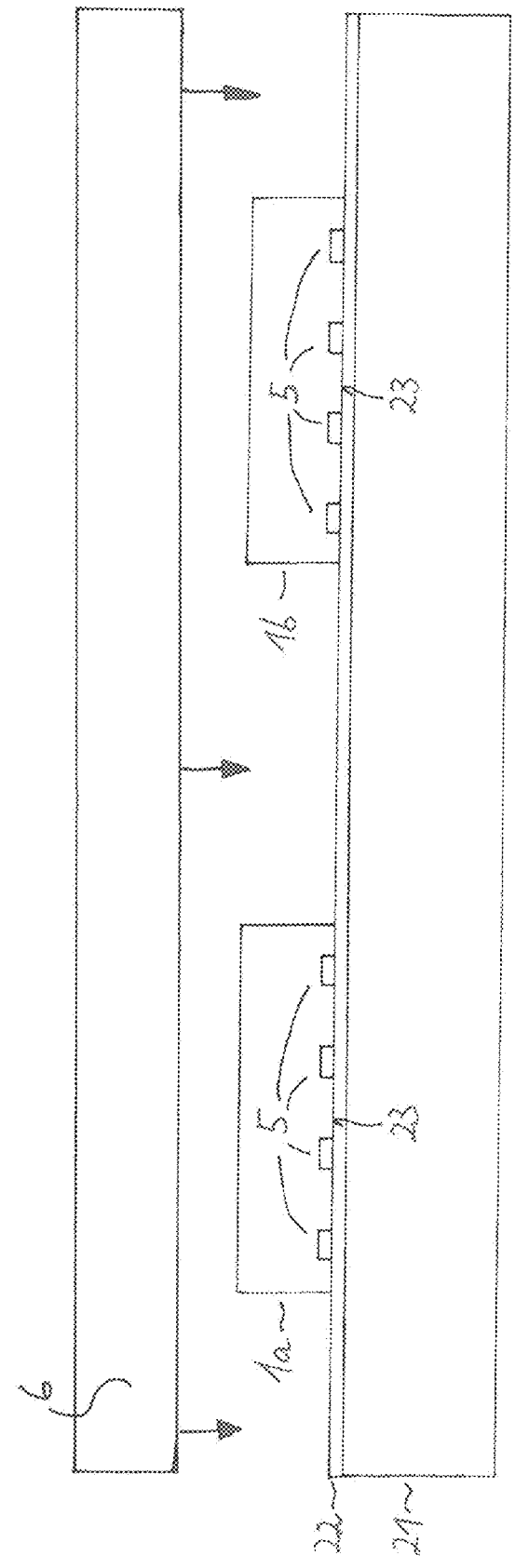

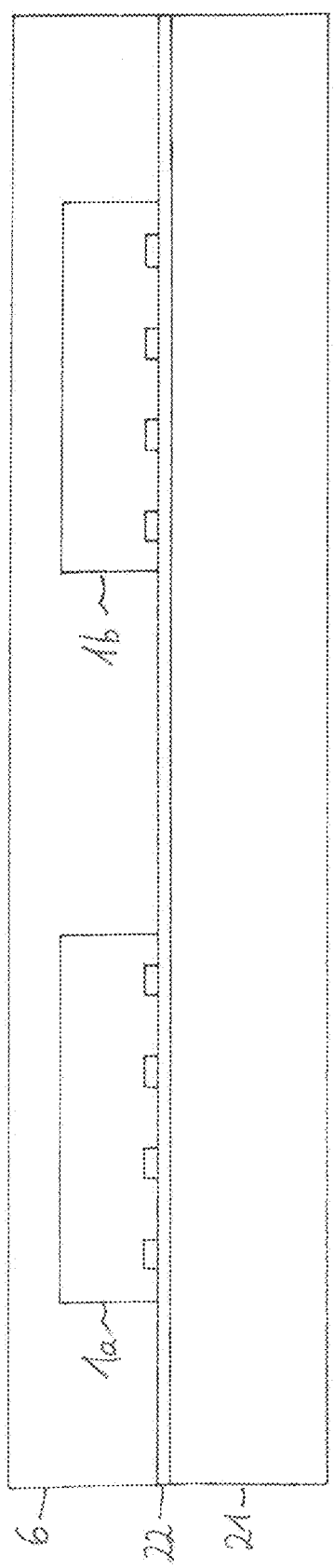
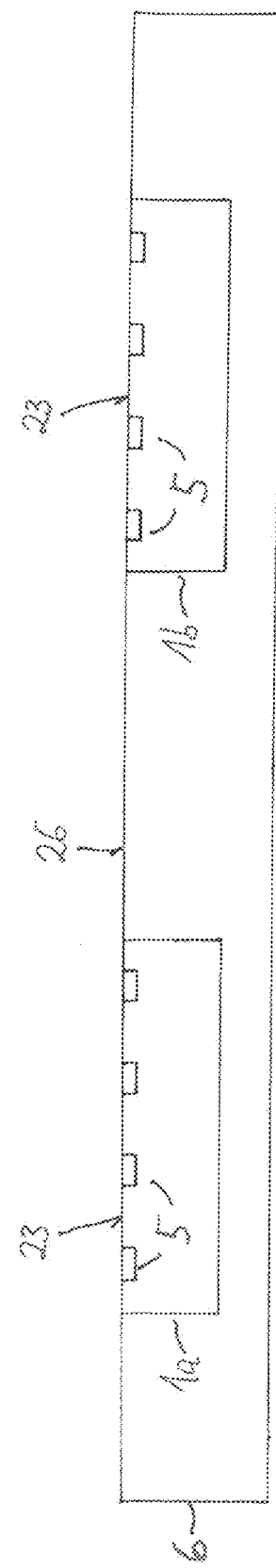

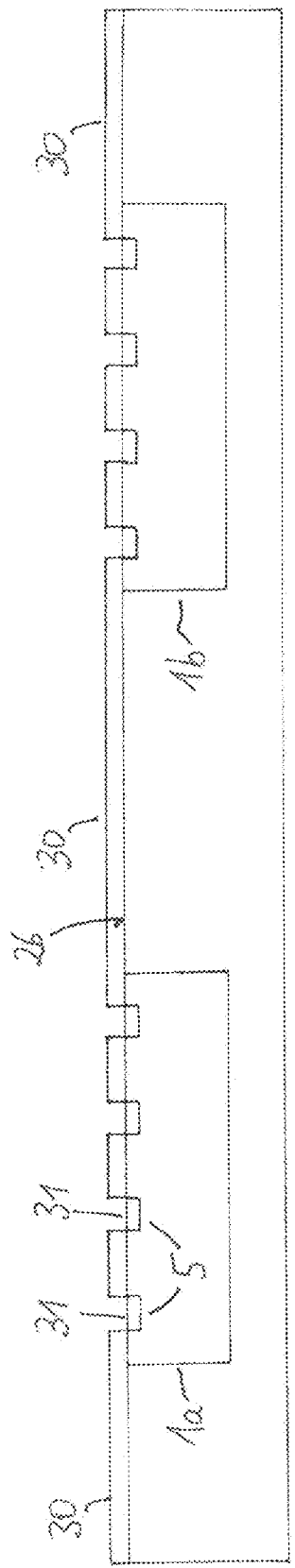
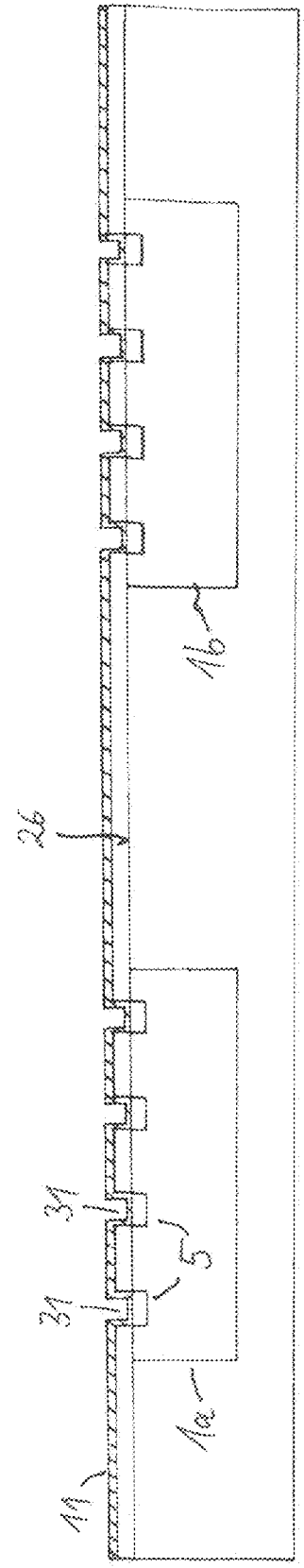

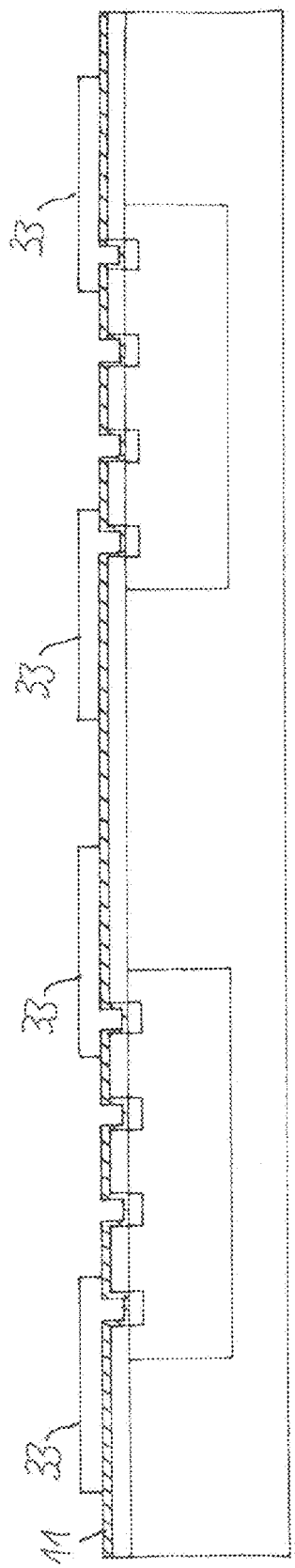
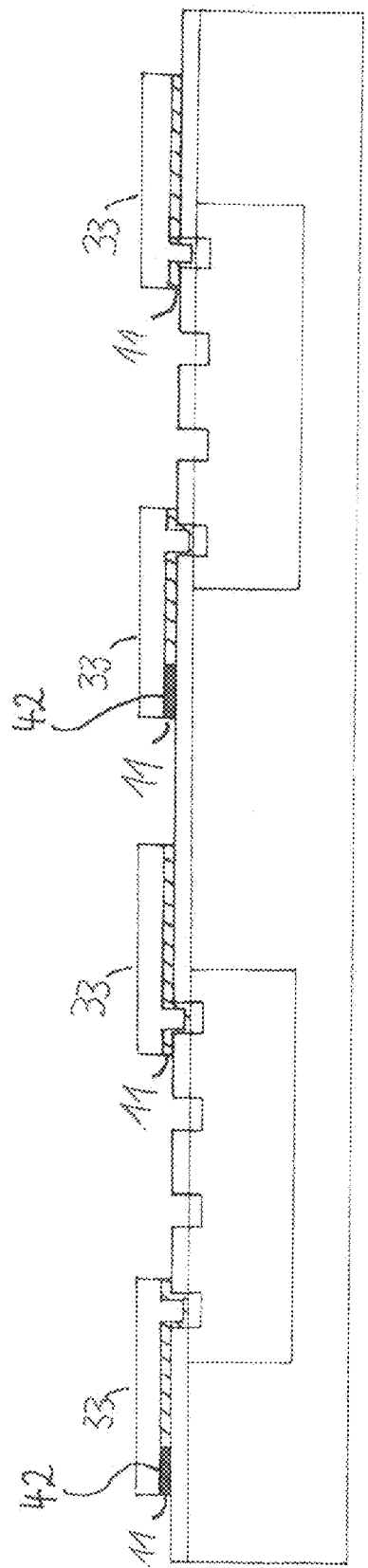

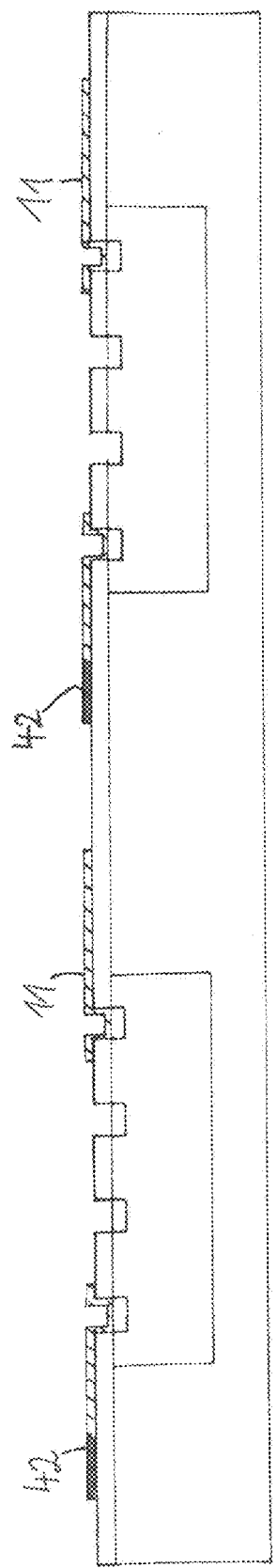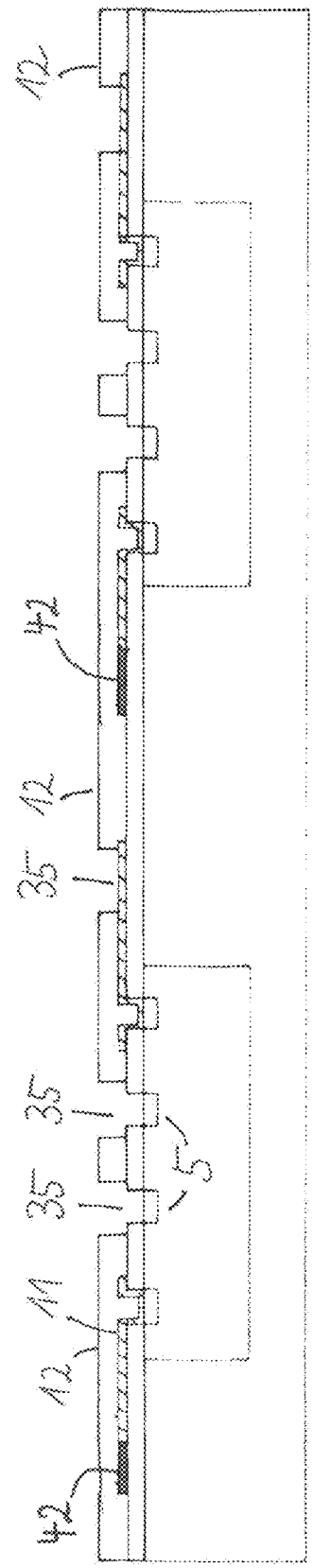

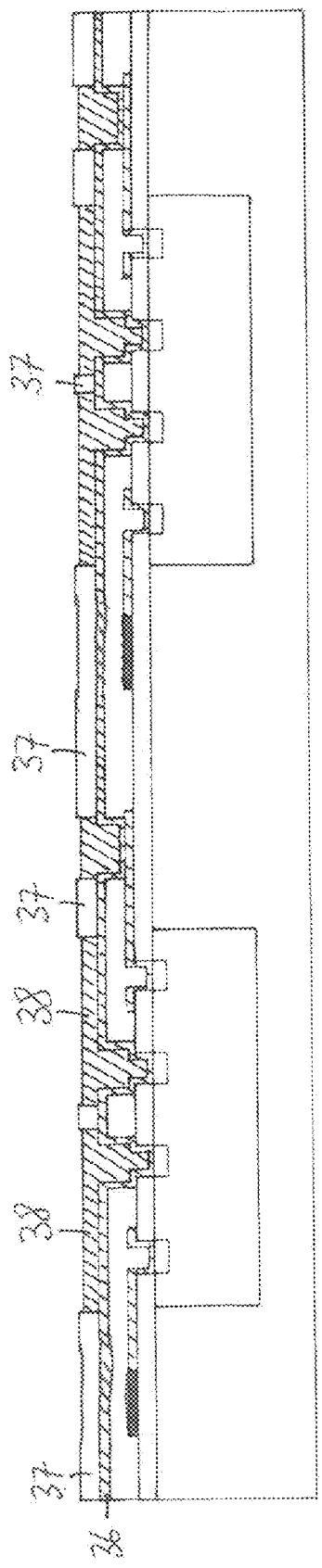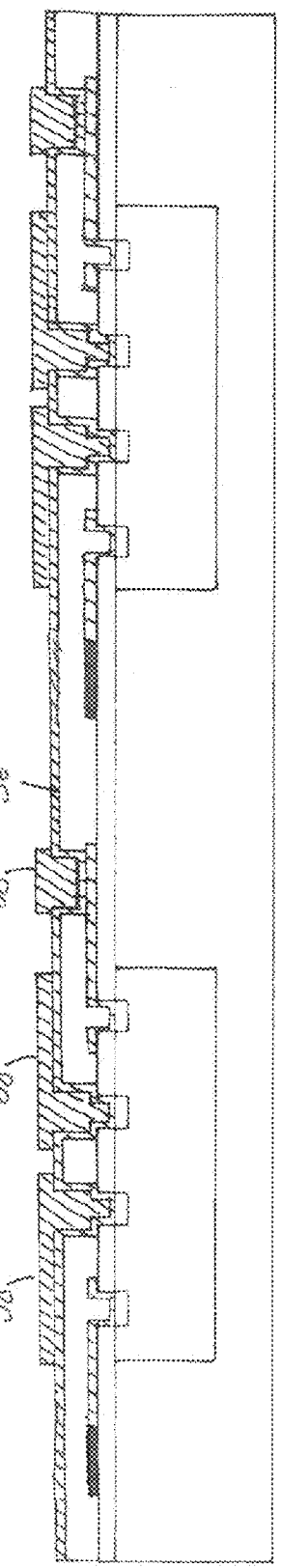

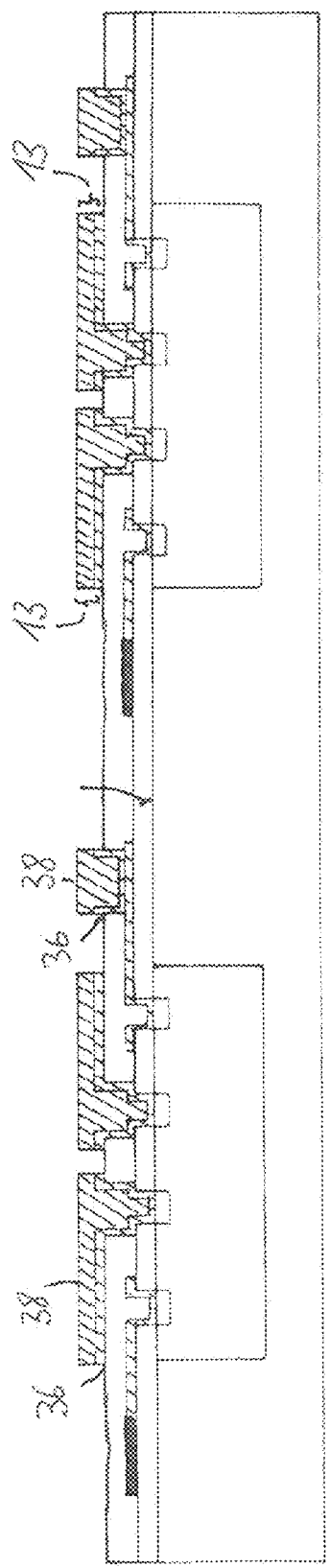
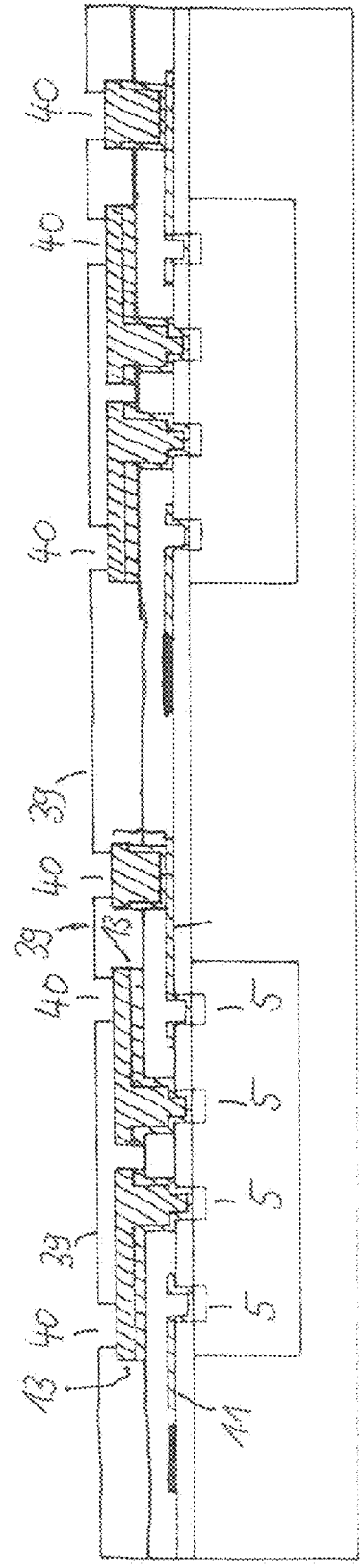

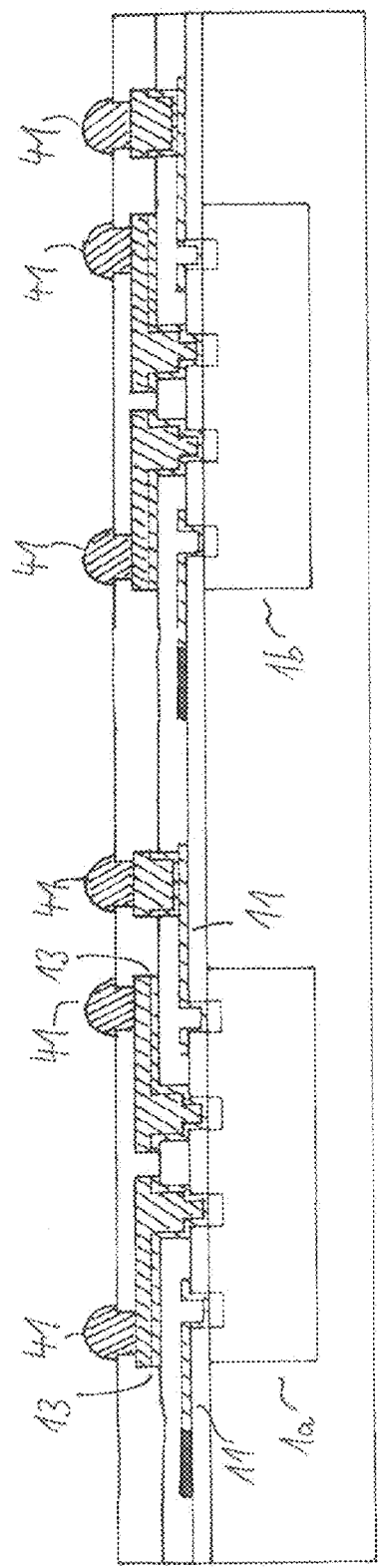
FIG. 3u
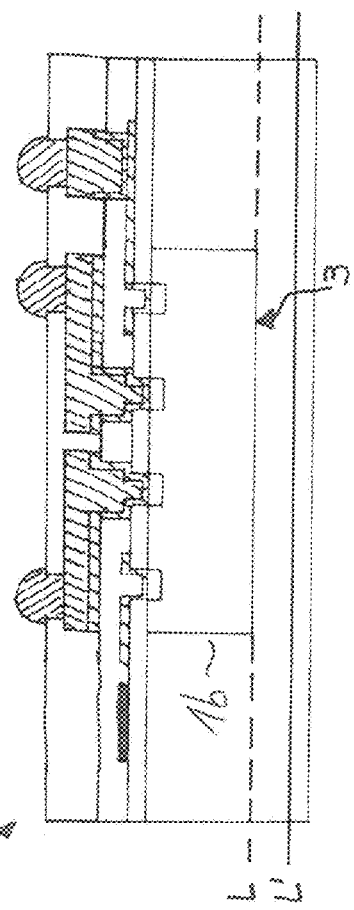
FIG. 3v
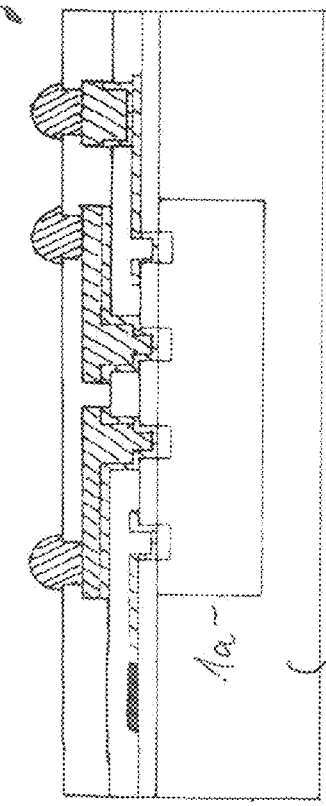

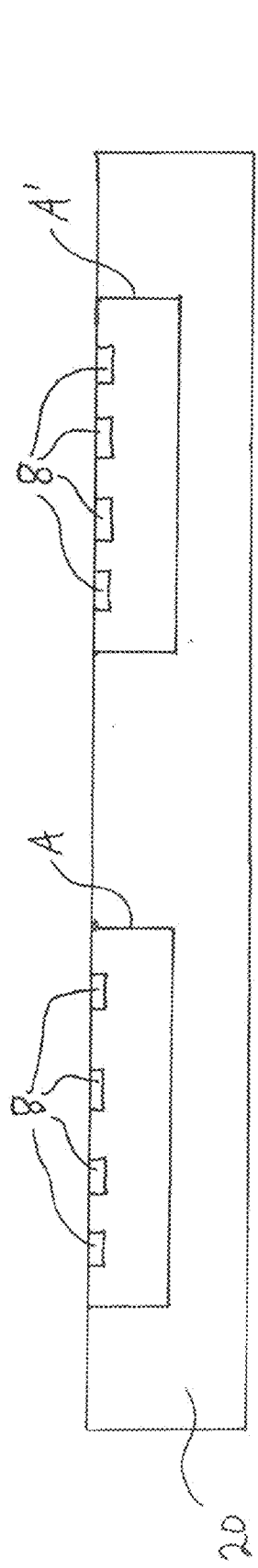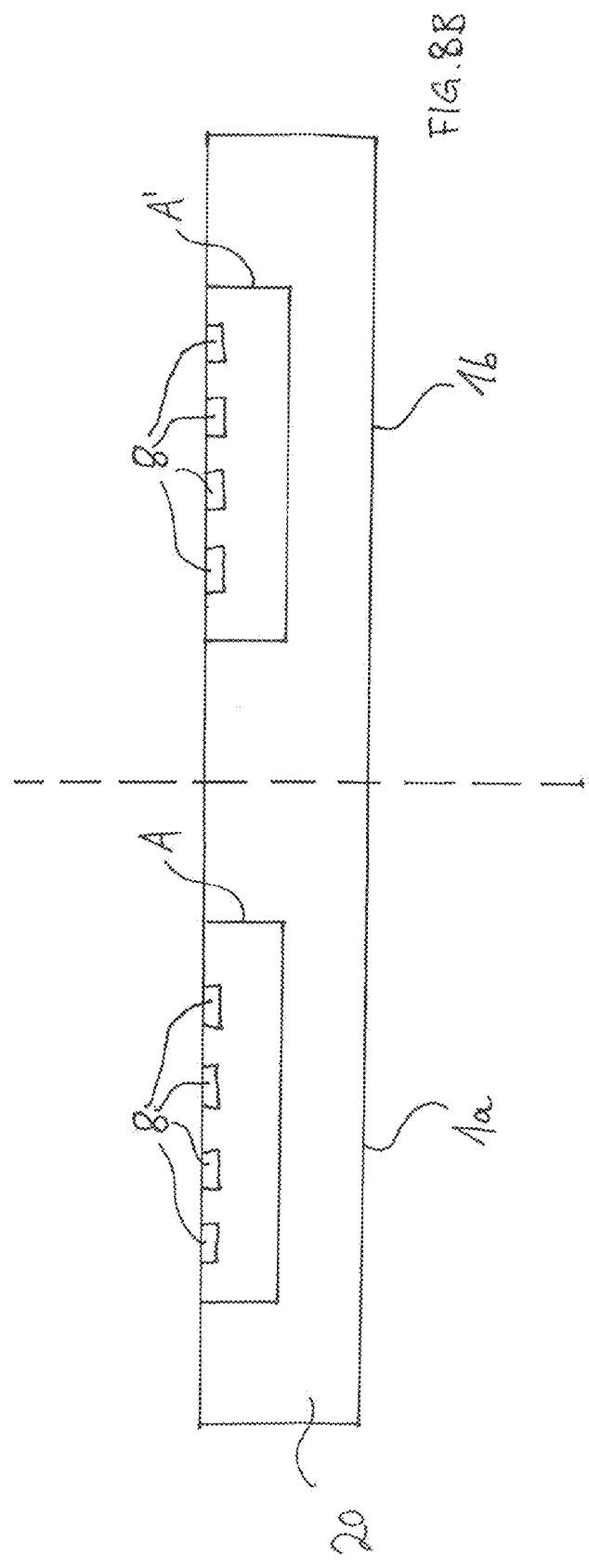
FIG. 8A
FIG. 8B

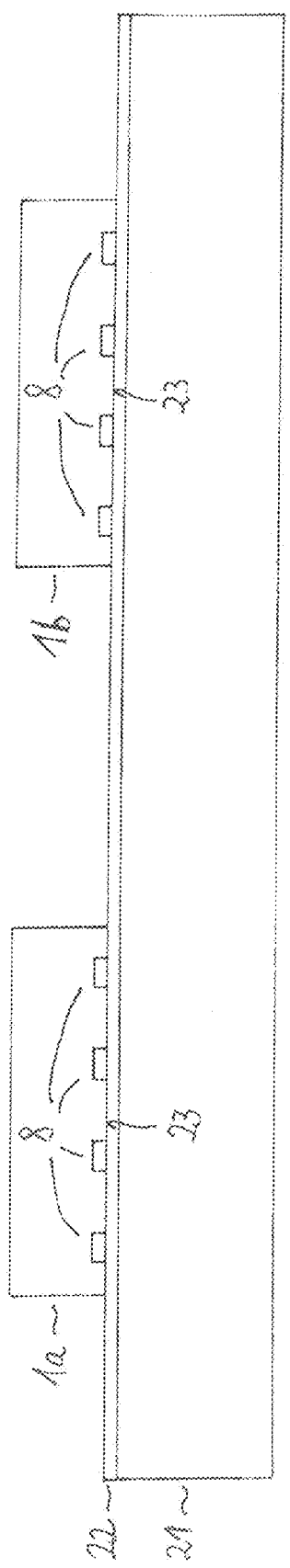
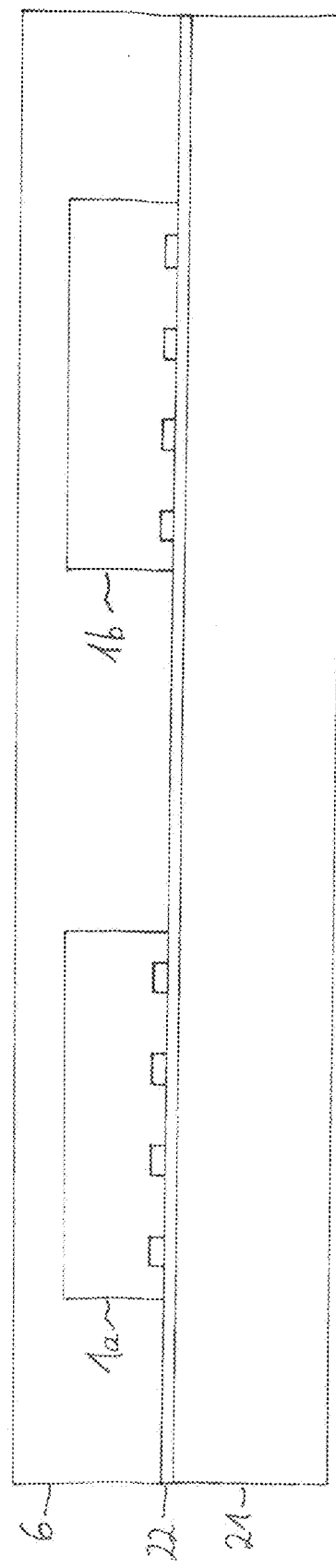

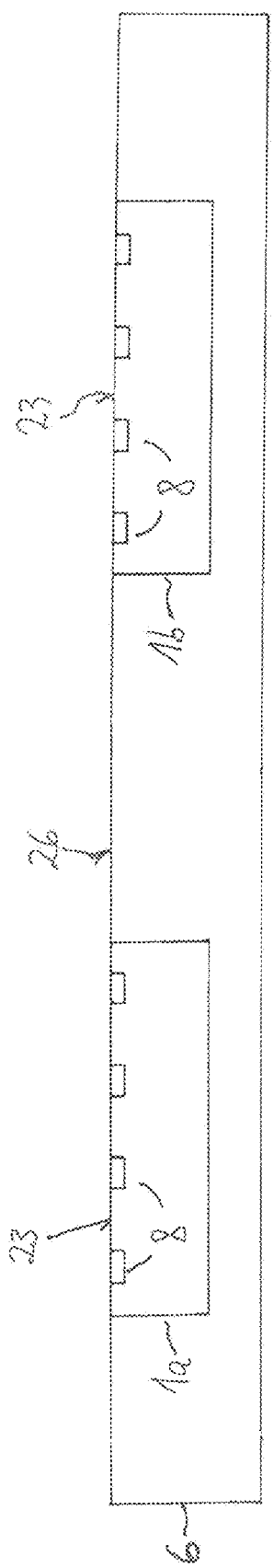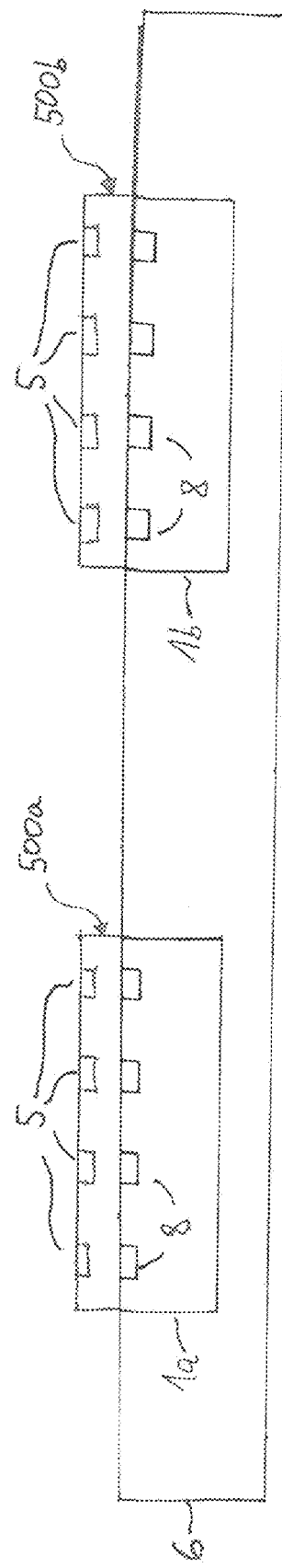

US 9,385,075 B2

GLASS CARRIER WITH EMBEDDED SEMICONDUCTOR DEVICE AND METAL LAYERS ON THE TOP SURFACE

TECHNICAL FIELD

This invention relates to devices including a semiconductor material. The invention further relates to methods for manufacturing such devices.

BACKGROUND

Semiconductor devices may include passive electronic components and active electronic components. A performance and a quality of a semiconductor device may depend on how integrated passive and active electronic components are arranged with respect to each other. In addition, a performance and a quality may depend on properties of the materials that are used for manufacturing the semiconductor device. Semiconductor devices and methods for manufacturing semiconductor devices constantly have to be improved. In particular, it may be desirable to improve a performance and a quality of semiconductor devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

FIGS. 8A to 8F schematically illustrates a cross-sectional view of a more detailed method for manufacturing a device in accordance with the disclosure;

DETAILED DESCRIPTION OF ILLUSTRATIVE EMBODIMENTS

Figure 1:
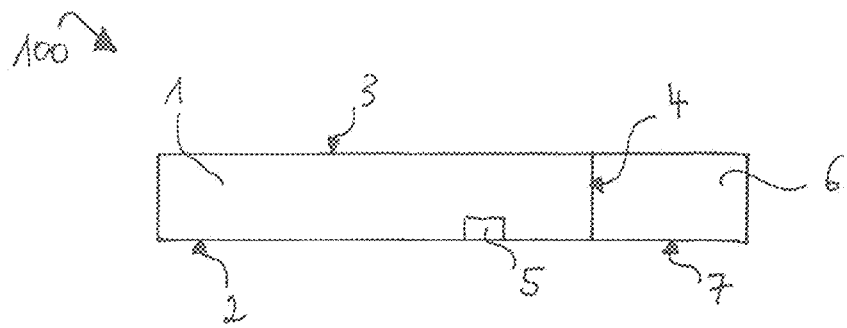
FIG. 1 schematically illustrates a cross-sectional view of a device 100 in accordance with the disclosure.

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is to be understood that other aspects may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary aspects described herein may be combined with each other, unless specifically noted otherwise.

As employed in this specification, the terms "coupled" and/or "electrically coupled" are not meant to mean that the elements must be directly coupled together. Intervening elements may be provided between the "coupled" or "electrically coupled" elements.

Devices including a semiconductor material (e.g., in form of a semiconductor substrate or one or more semiconductor chips) are described below. Included semiconductor chips may be of different types, may be manufactured by different technologies and may include integrated circuits containing active electronic components and/or passive electronic components. The integrated circuits may be designed as logic integrated circuits, analog integrated circuits, mixed signal integrated circuits, power integrated circuits, memory circuits or integrated passives. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the included semiconductor chips may be packaged or unpackaged.

The devices described herein may include a glass material. The term "glass material" may refer to a solid having a non-crystalline (or amorphous) structure and exhibiting a glass transition when heated towards a liquid point of the glass material. The term "glass transition" (or "glass-liquid transition") may refer to a reversible transition from a hard and/or brittle state of the glass material into a molten and/or rubber-like state of the glass material. A glass transition may e.g., be defined by threshold values of the glasses' viscosity, for example $10^{12}$ Pa·s. In addition, a glass transition may be characterized by a step in a thermal expansion coefficient and/or a step in a specific heat of the glass material.

Each glass material may have a characteristic glass transition temperature (or glass point temperature) at which a glass transition may occur. It is understood that a glass transition temperature may depend on further physical properties, for example on a pressure applied to the glass material. The glass transition temperature may particularly be lower than a melting temperature of a crystalline state of the glass material, if there is such crystalline state.

The glass material may be made of or may include various classes of materials. For example, the glass material may be or may include a silicate glass which may include about 40 percent or more of silica ($SiO_2$). In particular, the glass material may include at least 50 percent, 60 percent, 70 percent, 80 percent or 90 percent of an inorganic material. For the case of the glass material being completely made of an inorganic material, it is understood that a small amount of organic contaminations may be included in the glass material. The glass material may also be made of or may include a Low Temperature Co-Fired Ceramic (LTCC) material.

In various exemplary embodiments, the glass material may be made of or may include one or more of the following glass types: photosensitive glass, floating glass, soda-lime glass, borosilicate glass, alkali-free glass, and low-Tg glass. The glass material may also include an organic modified ceramics (ormocer) material. In addition, it is understood that the composition of the glass material may be chosen such that desired material properties of the glass material may be realized. For example, the glass material may be made of or may include one or more glass types having a coefficient of thermal expansion (CTE) that matches or is similar to a CTE of a material, in particular a semiconductor material, which is in contact with the glass material.

The devices described herein may include active electronic components. In particular, such active electronic components may be integrated in a semiconductor material (or a semiconductor substrate or a semiconductor chip) on the basis of an arbitrary appropriate manufacturing technique. Active electronic components may be or may include any kind of diodes, transistors, digital circuits, opto-electronic components, microelectromechanical systems (MEMS), etc.

The devices described herein may include passive electronic components. The passive electronic components may be integrated in a semiconductor material (or a semiconductor substrate or a semiconductor chip). Alternatively, the passive electronic components may be arranged in one or more layers, in particular metal layers, that may be arranged over a substrate which may be different from a semiconductor material, for example a glass material. Passive electronic components may be or may include any kind of resistors, capacitors, inductive components like inductors or coils, antennas, etc. Any appropriate technique may be used for manufacturing the passive electronic components, may it be in the semiconductor substrate or elsewhere.

The devices described herein may include contact elements (or contact pads) or heat dissipating elements that may be configured to provide an electrical contact to be made with integrated circuits included in a semiconductor chip. A contact element may include one or more metal layers applied to the semiconductor material of the semiconductor chips. The metal layers may be manufactured with any desired geometric shape and any desired material composition. Any desired metal or metal alloy, for example, aluminum, titanium, gold, silver, copper, palladium, platinum, nickel, chromium, vanadium, tungsten or molybdenum, may be used as a material. The metal layers need not be homogeneous or manufactured from just one material, i.e., various compositions and concentrations of the materials included in the metal layers may be possible.

The devices described herein may include one or more metal layers that may be placed over a semiconductor chip (or a semiconductor material). The metal layers may laterally extend over the semiconductor chip or over other layers arranged between the semiconductor chip and the metal layers, such as a dielectric layer. One or more of the metal layers may be partially located outside and/or within an outline (or a footprint) of the semiconductor chip.

The metal layers may be used to provide a redistribution layer. The metal layers may be employed as wiring layers to make electrical contact with a semiconductor chip from outside the device and/or to make electrical contact with other semiconductor chips and/or components contained in the device and/or for heat dissipating purposes. The metal layers may couple contact elements of the semiconductor chips to external contact elements that are described below. The metal layers may have further properties as well, for example they may be used as ground or electrical shielding layers. Also, a metal layer may represent at least a part of a passive electronic component as described above. It is noted that one or more of the metal layers may be thickened in order to provide better a heat transport capability and/or a better electrical performance.

The metal layers may be manufactured with any desired geometric shape and/or any desired material composition. For example, the metal layers may be structured and may have a shape of conductor lines (or conductor tracks), but may also be in the form of a layer covering an area. Any desired metal, for example aluminum, nickel, palladium, titanium, titanium tungsten, silver, tin, gold, molybdenum, vanadium or copper, or metal alloys may be used for manufacturing the metal layers. The metal layers need not be homogeneous or manufactured from just one material, that is to say various compositions and concentrations of the materials contained in the metal layers are possible. In addition, the metal layers may be arranged above or below or between electrically insulating layers.

The devices described herein may include external contact elements (or external contact pads), which may be of any shape and size. The external contact elements may be accessible from outside the device (or solder deposits may be placed on the external contact pads) and may thus allow electrical contact to be made with a semiconductor chip arranged in the device from outside the device. The external contact elements may be composed of any desired electrically conductive material, for example any desired metal, such as aluminum, nickel, palladium, titanium, titanium tungsten, silver, tin, gold, molybdenum, vanadium or copper, a metal alloy or an electrically conductive organic material. Solder material, such as solder balls or solder bumps, may be deposited on the external contact elements.

The devices described herein may include components that may be configured to operate in a radio frequency range. A radio frequency range may vary from about 100 MHz to about 500 GHz and any arbitrary interval arranged in between. In particular, a radio frequency range may refer to frequencies employed in cellular communications, e.g., an ultra-high frequency range ranging from about 300 MHz to about 6 GHz.

FIG. 1 schematically illustrates a cross-sectional view of a device 100. The device 100 includes a semiconductor material 1 including a first main surface 2, an opposite surface 3 opposite to the first main surface 2 and a side surface 4 extending from the first main surface 2 to the opposite surface 3. The device 100 further includes a first electrical contact element 5 arranged on the first main surface 2 of the semiconductor material 1. In addition, the device 100 includes a glass material 6 with a second main surface 7 wherein the glass material 6 contacts the side surface 4 of the semiconductor material 1 and wherein the first main surface 2 of the semiconductor material 1 and the second main surface 7 of the glass material 6 are arranged in a common plane.

Figure 2A:
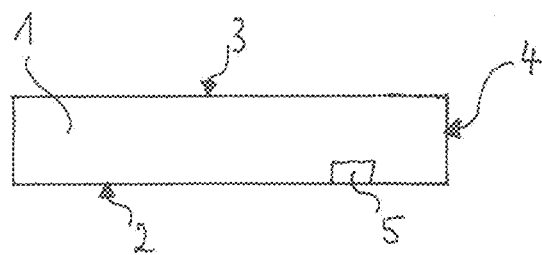
FIGS. 2A and 2B schematically illustrates a cross-sectional view of a method for manufacturing a device 200 in accordance with the disclosure.
Figure 2B:
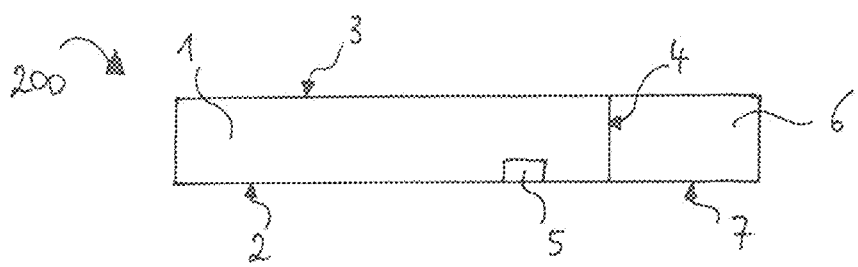

FIGS. 2A and 2B schematically illustrate a method for manufacturing a device. A cross section of a device 200 obtained by the method is illustrated in FIG. 2B. The device 200 may be similar to the device 100 of FIG. 1. In a first step (see FIG. 2A), a semiconductor material 1 is provided. The semiconductor material 1 includes a first main surface 2, an opposite surface 3 opposite to the first main surface 2 and a side surface 4 extending from the first main surface 2 to the opposite surface 3. An electrical contact element 5 is arranged on the first main surface 2 of the semiconductor material 1. In a second step (see FIG. 2B), a glass material 6 including a second main surface 7 is applied. The glass material 6 is applied such that the glass material 6 contacts the side surface 4 of the semiconductor material 1 and such that the first main surface 2 of the semiconductor material 1 and the second main surface 7 of the glass material 6 are arranged in a common plane.

FIGS. 3A to 3V schematically illustrate a method for manufacturing a device 300, a cross section of which is shown in FIG. 3V. The device 300 may be seen as an implementation of the devices 100 and 200 such that details of the device 300 described below may be likewise applied to the devices 100 and 200. In addition, the method shown in FIGS. 3A to 3V may be seen as an implementation of the method illustrated in FIGS. 2A and 2B. Details of the manufacturing method that are described below may therefore be likewise applied to the method of FIGS. 2A and 2B.

Figure 5:
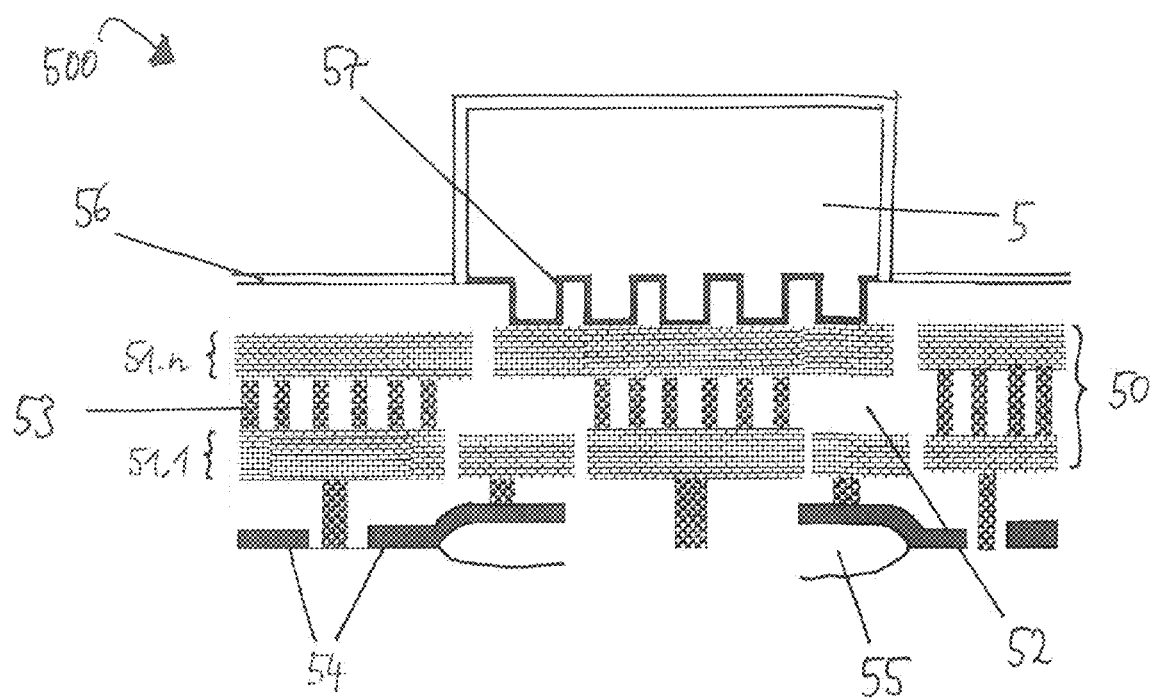
FIG. 5 schematically illustrates a cross-sectional view of an inner structure 500 of a device.

In FIG. 3A, a semiconductor wafer 20 may include areas including semiconductor components. Two exemplary areas are indicated by lines A and A'. At a later time of the manufacturing process, semiconductor devices (or semiconductor chips) 1a and 1b may be produced including these semiconductor components. It is noted that the semiconductor material 20 may be similar to the semiconductor material 1 of e.g., FIG. 1. It is understood that the semiconductor wafer 20 may be used to produce an arbitrary number of semiconductor devices. Each of the produced semiconductor devices 1a and 1b may include one or more contact elements 5. In addition, each of the semiconductor devices 1a and 1b may include passive electronic components and/or active electronic components. Note that a more detailed exemplary inner structure of a similar semiconductor device is illustrated in FIG. 5.

In FIG. 3B, the semiconductor wafer 20 is separated into a plurality of semiconductor devices (see dashed line). It is noted that the individual components resulting from such dicing are not necessarily restricted to include only one semiconductor component. For example, a singulated component may also include multiple semiconductor components that may be electrically coupled.

In FIG. 3C, a carrier 21 is provided. The carrier 21 may be a plate made of a rigid material, for example a metal, such as nickel, steel or stainless steel, laminate, film or a material stack. In principle, any material resistant against the processing conditions, like e.g., processing temperatures or processing pressures, of the described methods may be used. The carrier 21 may have at least one flat surface on which components of the device that is to be manufactured may be placed. The shape of the carrier 21 is not limited to any geometric shape, for example the carrier 21 may be round or square-shaped. In addition, the carrier 21 may have any appropriate size.

In FIG. 3D, a mechanical fixing layer 22 may be applied, for example laminated, onto a surface of the carrier 21. For example, the mechanical fixing layer 22 may be made of or may include an adhesive tape, e.g., a double sided sticky tape. It is noted that using the mechanical fixing layer 22 is optional and may also be omitted. The mechanical fixing layer 22 may be configured to fix components that may be placed on the surface of the mechanical fixing layer 22 to the carrier 21. The mechanical fixing layer 22 may be continuous and may substantially cover the whole surface of the carrier 21. Alternatively, the mechanical fixing layer 22 may also be structured wherein its structure may be adapted to the positions of the components that are to be fixed. It is understood that any other appropriate technique may be used to fix components to the carrier 21, for example using a liquid adhesive material.

In FIG. 3E, a first semiconductor device 1a and a second semiconductor device 1b as well as possibly further semiconductor devices (not shown) may be placed over the carrier 21. For example, the semiconductor devices 1a and 1b of FIG. 3B may be used in this connection. Note that, compared to FIG. 3A, the lines A and A' are omitted in FIG. 3E. The semiconductor devices 1a and 1b may be fixed on the mechanical fixing layer 22. For attaching the semiconductor devices 1a and 1b to the carrier 21, other kinds of attaching materials may be used alternatively. However, it is noted that an employment of the mechanical fixing layer 22 may also be omitted completely. The semiconductor devices 1a and 1b and the possibly further semiconductor devices may e.g., be arranged in an array.

The semiconductor devices 1a and 1b may be relocated on the carrier 21 in larger spacing as they have been arranged in the semiconductor wafer 20 of FIG. 3A. The semiconductor devices 1a and 1b may have been manufactured on the same semiconductor wafer, but may also alternatively have been manufactured on different wafers. In addition, the semiconductor devices 1a and 1b may be physically identical, but may also contain different integrated circuits and/or represent different components. Before the semiconductor devices 1a and 1b are placed on the carrier 21, they may be thinned, for example by grinding their backsides, down to a thickness lying in a range from about 30 to about 700 μm (micrometers) and more particular in a range from about 40 to about 300 μm (micrometers). An even more particular thickness has a value of about 250 μm. It is noted that the function and the dimensions of the semiconductor device 1a may be different from the function and/or the dimensions of the semiconductor chip 1b, however both semiconductor chips 1a and 1b may also have identical functions and/or dimensions.

The surfaces of the semiconductor devices 1a and 1b including the contact elements 5 may be referred to as active (main) surfaces 23. The semiconductor devices 1a and 1b may particularly be arranged over the carrier 21 with their active main surfaces 23 facing the carrier 21. Integrated circuits embedded in the semiconductor devices 1a and 1b may be electrically accessible via the contact elements 5. The contact elements 5 may be made of a metal, for example aluminum, nickel, palladium, titanium, titanium tungsten, silver, tin, gold, molybdenum, vanadium or copper.

In FIG. 3F, a glass material 6 may be applied after the semiconductor devices 1a and 1b have been mounted on the carrier 21. The glass material 6 may be a glass wafer 6. Similar to the carrier 21, the glass wafer 6 is not necessarily limited to any geometric shape and may e.g., be round or square-shaped. Furthermore, the glass wafer 6 may have any appropriate size. The glass material 6 may be made of or may comprise any of the materials that have been described in other sections of this specification.

Before applying the glass wafer 6, the glass material 6 may be heated to a temperature that is greater than the glass transition temperature of the glass material 6. As a result, the glass wafer 6 may transform into a molten or rubber-like state. Of course, the material of the glass wafer 6 may be chosen to have a glass transition temperature such that the semiconductor devices 1a and 1b and/or any other components of the device that is to be fabricated is/are not damaged due to high temperatures. In another embodiment, it may also be possible to not only heat the glass material 6, but also additional components, in particular the complete arrangement or stack.

If a rubber-like state is reached, the glass material 6 may be applied such that the semiconductor devices 1a and 1b are encapsulated by the glass material 6 as illustrated in FIG. 3G. For this purpose, the glass wafer 6 may be pressed against the carrier 21 and/or the carrier 21 may be pressed against the glass wafer 6. It is noted that the carrier 21 and/or the mechanical fixing layer 22 (if used) may have a property that the glass material 6 that is heated over the glass transition point does not (or at least not) adhere to the carrier 21 and/or the mechanical fixing layer 22 (if used). A reduced adhesion may e.g., be obtained by covering the carrier 21 and/or the mechanical fixing layer 22 (if used) with a boron nitride layer (or coating) or other non-sticking layers or coatings that may e.g., be made of or may include diamond-like carbon (DLC), a:C—H, aluminum oxide ($Al_2O_3$), etc.

When applying the glass material 6, gaps between the semiconductor devices 1a and 1b may be filled with the glass material 6 such that side surfaces of the semiconductor devices 1a and 1b may be covered by the glass material 6, respectively. In particular, there may be a direct physical contact between the glass material 6 and the side surfaces of the semiconductor devices 1a and 1b. It is understood that such physical contact may not be complete or perfect, since there may occur enclosures (e.g., air or impurities) located between the glass material 6 and the semiconductor devices 1a and 1b. In an embodiment, such enclosures may also be omitted completely. After the glass wafer 6 has been applied, the temperature may be reduced to a value which is smaller than the glass transition temperature of the glass material 6. As a result, the glass material 6 leaves the rubber-like state and transforms back to a hard and brittle state of a glass.

In FIG. 3H, the semiconductor devices 1a and 1b covered with the glass material 6, but the top surface, may be released from the carrier 21. The mechanical fixing layer 22 may be peeled from the semiconductor devices 1a and 1b as well as from the glass material 6. The mechanical fixing layer 22 may have thermo-release properties allowing a removal of the mechanical fixing layer 22 during a heat-treatment. The removal of the mechanical fixing layer 22 from the carrier 21 may be carried out at an appropriate temperature, which depends on the thermo-release properties of the mechanical fixing layer 22. It is understood that any other suitable technique may be used to remove the mechanical fixing layer 22.

After the release of the carrier 21 and the mechanical fixing layer 22, the active main surfaces 23 of the semiconductor devices 1a and 1b as well as a surface of the glass material 6 may form a common planar surface 26, i.e., may be arranged in a common plane. As described in the following, a redistribution layer may be placed over the common planar surface 26 of the semiconductor devices 1a, 1b and the glass material 6.

In FIG. 3I, a dielectric layer 30 may be deposited on the surface 26. The dielectric layer 30 may be fabricated in various ways. For example, the dielectric layer 30 may be deposited from a gas phase or from a solution or it may be laminated onto the surface 26. In addition or alternatively, a thin-film technology or a standard PCB industry process flow may be used for an application of the dielectric layer 30. The dielectric layer 30 may be fabricated from a polymer, e.g., polynorbornene, parylene, photoresist material, imide, epoxy, duroplast, silicone, silicon nitride, silicon oxide or an inorganic, ceramic-like material, such as silicone-carbon compounds. The thickness of the dielectric layer 30 may be up to 10 µm (micrometers) or even higher.

The dielectric layer 30 may be opened at locations where the contact elements 5 are arranged. The resulting openings 31 may be used to provide electrical contacts to integrated circuits embedded in the semiconductor devices 1a and 1b, respectively. By way of example, the openings 31 in the dielectric layer 30 may be produced by using photolithographic methods and/or etching methods and/or laser drilling.

In FIG. 3J, a first metal layer 11 may be arranged over the dielectric layer 30. The first metal layer 11 may also cover the contact elements 5 that may have been exposed by the openings 31 in the dielectric layer 30. The first metal layer 11 may be deposited by using sputtering, electroless deposition, evaporation or any other appropriate technique. The first metal layer 11 may include or may be made of aluminum, nickel, palladium, titanium, titanium tungsten, silver, tin, gold, molybdenum, vanadium or copper, or metal alloys.

In FIG. 3K, an etch resist layer 33, for example a photoresist layer, may be spin-coated on top of the first metal layer 11. By exposure to light of a suitable wavelength through a mask and subsequent development, the etch resist layer 33 may be selectively removed. Referring to FIG. 3K, it is noted that the etch resist layer 33 may be structured not only within the cross-sectional plane of FIG. 3K, but also in a direction perpendicular to this plane. In other words, the etch resist layer 33 may be structure in more than one dimensions. The etch resist layer 33 may also be deposited by using printing techniques.

In FIG. 3L, portions of the first metal layer 11, which are not covered by the etch resist layer 33, may be removed by an etching step such that a structured first metal layer 11 may be provided. It is noted that a structuring of the first metal layer 11 may be used to fabricate passive elements. For example, at selected locations, the first metal layer 11 may be structured such that a conductive line circled in multiple windings may be provided. Such circled conductive line may e.g., fulfill a function of an inductor 42. As an exemplary alternative, a thin film resistor or a capacitor may be fabricated at the position of the inductor 42. Any suitable method may be used to fabricate an arbitrary number of passive elements in the first metal layer 11 or, more general, in the redistribution layer. Note that the passive elements are not restricted to be merely made of the first metal layer 11, but may also include further materials. Note further that the passive elements may particularly be arranged over the glass material 6, i.e., outside an outline (or a footprint) of the semiconductor devices 1a and 1b. However, it is understood that there may also be one or more passive components that may be arranged over the semiconductor material of the semiconductor devices 1a and 1b. For example, a quality or performance of a passive component may be evaluated less important than a certain value of a component density of packing density to be realized. In order to fulfill a desired packing density such component may be placed over the semiconductor material, even though a performance or quality of the components may suffer from such arrangement.

In FIG. 3M, the etch resist layer 33 may be stripped away, for example by using an appropriate method like dry etching or wet etching.

In FIG. 3N, a dielectric layer 12 may be deposited over or on the first metal layer 11 and other layers deposited on the surface 26. The dielectric layer 12 may be opened at locations 35 where external contact pads may be arranged later on and/or where contact elements 5 of the semiconductor devices 1a and 1b may be located that are not electrically coupled to the first metal layer 11. The dielectric layer 12 may be manufactured by using similar materials and similar manufacturing steps as described in connection with the dielectric layer 30.

Figure 3O:
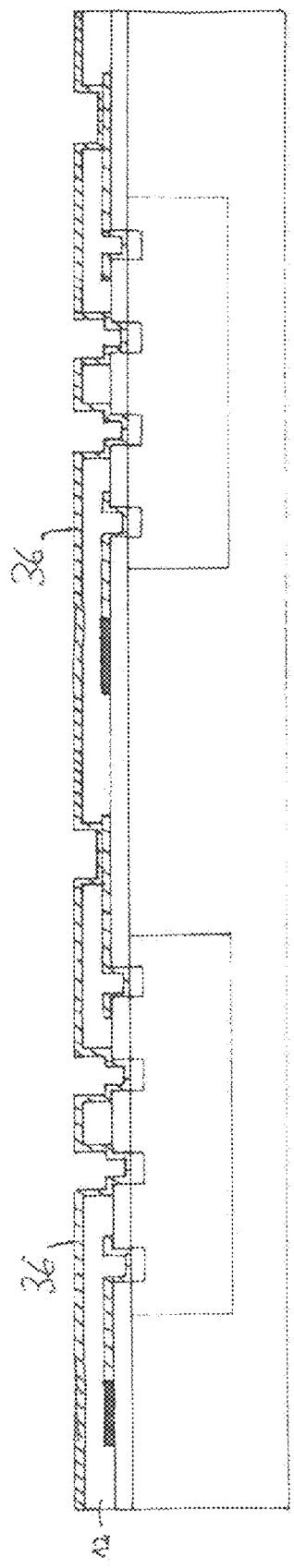
FIGS. 3A to 3V schematically illustrates a cross-sectional view of a more detailed method for manufacturing a device 300 in accordance with the disclosure.

In FIG. 3O, a seed layer 36 may be deposited over or on the dielectric layer 12 and the underlying surfaces exposed by the openings 35 in the dielectric layer 12. The seed layer 36 may be made of any suitable metal or metal alloy and may e.g., have a thickness smaller than 300 nm. The seed layer 36 may be manufactured by using similar methods as described in connection with the first metal layer 11. In addition, the seed layer 36 may be deposited by employing sputtering, electroless deposition, evaporation or any other appropriate technique. As will become apparent from the following, the seed layer 36 may particularly be used to form a second metal layer over the dielectric layer 12. It is however understood that such second metal layer is optional and there may also be further embodiments that may omit such second metal layer.

Figure 3P:
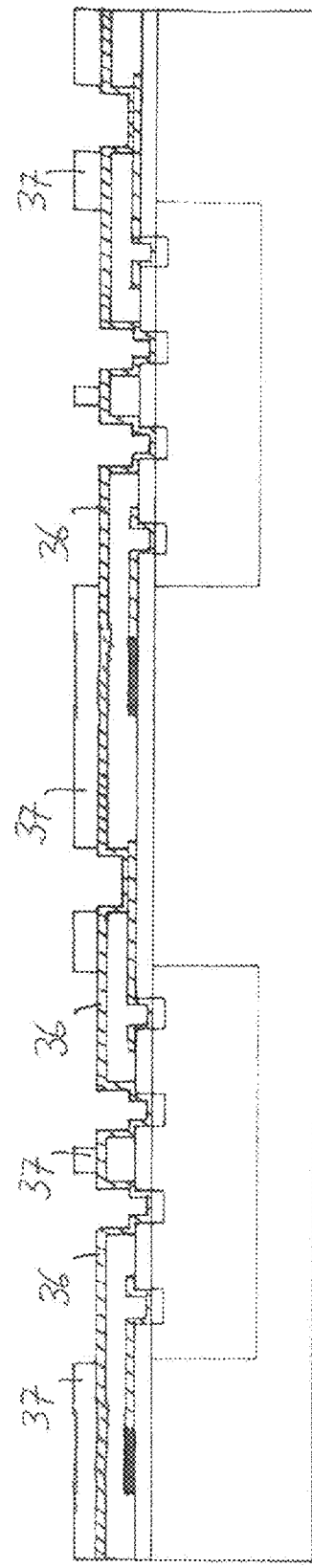

In FIG. 3P, a plating resist layer 37 (e.g., a photoresist layer) may be spin-coated over or on the seed layer 36. The plating resist layer 37 may be selectively removed by exposure to light having a suitable wavelength through a mask and subsequent development. The plating resist layer 37 may also be deposited by using printing techniques.

In FIG. 3Q, parts of the seed layer 36, which are not covered with the plating resist layer 37, may be reinforced by e.g., galvanic deposition of a further metal layer 38. During such galvanic deposition of the metal layer 38, the seed layer 36 may have a function of an electrode. For example, copper or other metals or metal alloys may be plated onto the seed layer 36 in unmasked areas and to a desired height. It is noted that an employment of the plating resist layer 37 as described above may also be omitted in alternative embodiments in which the described structuring may be achieved by any other suitable technique.

In FIG. 3R, the plating resist layer 37 may be stripped away, e.g., by using an appropriate method like dry etching or wet etching.

In FIG. 3S, exposed parts of the seed layer 36, which are not covered by the metal layer 38, may be removed by an etching procedure, thereby creating a structured metal layer including the seed layer 36 and the metal layer 38. The seed layer 36 and the metal layer 38 deposited on the seed layer 36, may be considered as a second metal layer 13.

In FIG. 3T, a dielectric layer 39 may be deposited over or on the second metal layer 13 and may be opened at locations where external contact pads 40 may be arranged later on. The dielectric layer 39 may be manufactured and structured by using similar materials and processing steps as described above in connection with the dielectric layer 30. The external contact pads 40 may allow to electrically contact the contact elements 5 of the semiconductor devices 1a and 1b from outside the device. Some of the external contact pads 40 may be exposed surfaces of the second metal layer 13 directly coupled to the contact elements 5 while other external contact pads 40 may be coupled to the contact elements 5 via the first metal layer 11. In the latter case, the second metal layer 13 deposited on the first metal layer 11 in the area of the external contact pads 40 may have a function of an under bump metallization. Such under bump metallization may allow to place solder balls on the external contact pads 40.

In FIG. 3U, solder deposits 41 may be arranged on the external contact pads 40. The solder deposits 41 may be applied to the external contact pads 40 by "ball placement," in which pre-shaped balls composed of solder material may be applied to the external contact pads 40. Alternatively, the solder deposits 41 may be applied by means of stencil printing, screen printing or other appropriate techniques with a solder paste or solder balls, followed by a heat-treatment process. The solder material may be formed from metal alloys including one or more of SnPb, SnAg, SnAgCu, SnAgCuNi, SnAu, SnCu, SnBi or Indium containing alloys. The solder deposits 41 may be used to electrically or mechanically couple the device to other components, for example a PCB. In addition, the solder deposits 41 may be used to establish or support a heat dissipation in a direction away from the device.

In FIG. 3V, devices 300 are provided by separating the semiconductor devices 1a and 1b from one another, for example by sawing, cutting, milling, etching or a laser beam.

It is understood that the method described in connection with FIGS. 3A to 3V may include further steps which are not explicitly illustrated herein. For example, in a further method step, the glass material 6 may be removed from the backside of the device 300, i.e., the side adjacent to the opposite side 3 of the semiconductor device 1a or 1b. Removing the glass material 6 may be performed before or after the devices 300 have been separated from each other as shown in FIG. 3V. The glass material 6 may be removed by any appropriate procedure, for example using etching, grinding, etc. In one approach, the glass material 6 may be removed such that a side of the glass material 6 on which the glass material 6 has been removed and the opposite side 3 of the semiconductor device 1a or 1b are arranged in a common plane (see dashed line L). In this case, the opposite side 3 of the semiconductor device 1a, 1b may be exposed from the glass material 6 such that heat may be dissipated away from the device 300 during an operation of the device 300. The exposed backside of the semiconductor device 1a, 1b may e.g., be in contact with air or a heat sink. In a further approach, the glass material 6 may not completely be removed from the backside of the device 300 (see solid line L') such that a thin layer of glass material 6 may remain on the opposite side 3 of the semiconductor device 1a, 1b. The thickness of the remaining thin layer may be chosen such that the semiconductor device 1a, 1b may be sufficiently electrically insulated from other components and such that a heat dissipation away from the device 300 is not significantly avoided or reduced by the glass material 6. A further possibility to withdraw heat from the device 300 may be an application of a metal layer on the backside of the device 300.

It is noted that the devices 300 may be referred to as fan-out type packages. The glass material 6 may allow the redistribution layer to extend beyond an outline (or a footprint) of the semiconductor devices 1a and 1b. The external contact pads 40 therefore do not need to be arranged within the outline of the semiconductor devices 1a and 1b, but may be distributed over a larger area. Such increased area available for an arrangement of the external contact pads 40 as a result of the glass material 6 means that the external contact pads 40 may not only be arranged at a great distance from one another, but that a maximum number of external contact pads 40 which may be arranged there is likewise increased compared to a scenario in which all external contact pads 40 are arranged within an outline of the semiconductor devices 1a and 1b.

It is understood that the devices 300 and the manufacturing thereof are exemplary and many variations are possible. For example, further semiconductor chips, active electronic components and/or passive electronic components may be included in the same device 300. The semiconductor chips, active electronic components and/or passive electronic components may differ in function, size, manufacturing technology etc. It is further understood that the devices 300 may include more than two metal layers and/or dielectric layers, for example three, four or five metal layers and/or dielectric layer stacked on top of each other. Each of the metal layers may include passive electronic components.

The specified device 300 and the method for manufacturing the device 300 may have the following effects. Such effects may also be observed in connection with any other device or method in accordance with the disclosure.

The semiconductor material 20 and the glass material 6 may be arranged in a common plane (see e.g., FIG. 3H). Hence, multiple of the above described fabrication steps may be performed in parallel, on the one hand for areas arranged over the semiconductor devices 1a, 1b in which particularly active electronic components may be arranged, on the other hand for areas lying over the glass material 6 where particularly passive electronic components may be arranged (e.g., in a metal layer).

The glass material 6 may be in direct contact to the semiconductor material 20 such that a distance between active electronic components arranged in the semiconductor material 20 and passive electronic components arranged over the glass material 6 may be minimized. Such small distances may reduce a stray inductance and/or a stray capacitance which may occur when components of the semiconductor device 300 operate at frequencies lying in a radio frequency range.

Using the glass material 6 as a carrier and/or substrate for passive electronic components may improve a quality and a performance of the device 300. Similarly, using the semiconductor material 20 as a carrier and/or substrate for integrated circuits and active electronic components may improve a quality and a performance of the device 300.

Compared to other materials, the glass material 6 may be more inert with respect to changes in temperature and/or changes in pressure. During processing, this may lead to a better compatibility to high temperature and/or low pressure process conditions. This may result in an improved chemical, mechanical and thermal stability.

Compared to other materials, the glass material 6 may be less expensive and easier to be processed.

Compared to other materials, it may be easier to remove the glass material 6 from the backside of the device 300 as it has been described above.

Compared to other materials, the glass material 6 may provide a better electrical, environmental and thermal insulation of the semiconductor devices 1a and 1b.

Figure 4A:
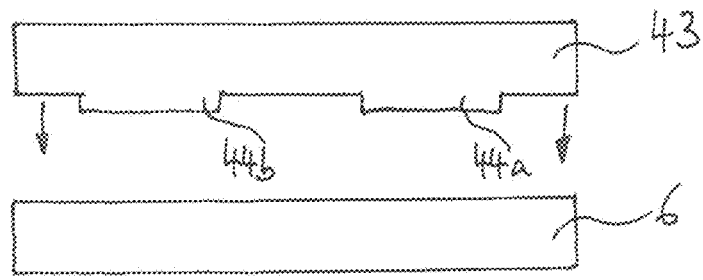
FIGS. 4A to 4C schematically illustrates a cross-sectional view of a more detailed method for manufacturing a device in accordance with the disclosure.
Figure 4B:
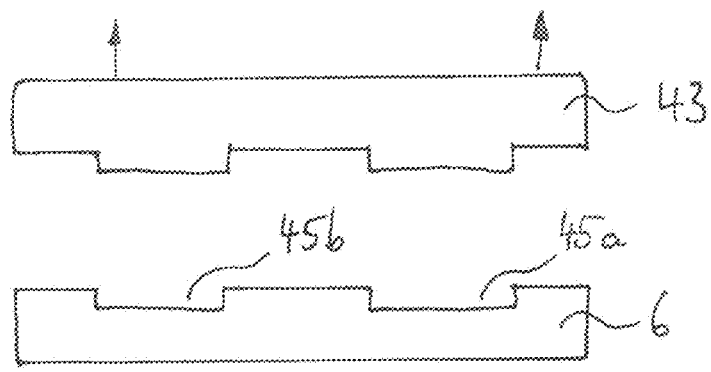
Figure 4C:
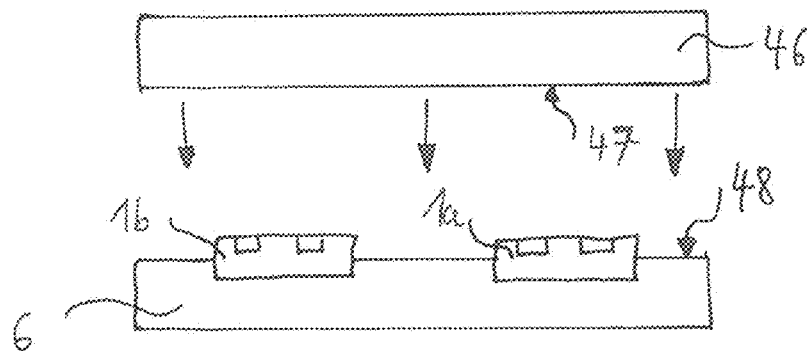

FIGS. 4A to 4C schematically illustrate a method for manufacturing a device in accordance with the disclosure. The method may include one or more additional steps described in connection with FIGS. 3A to 3V. Therefore, comments made in connection with FIGS. 3A to 3V may also hold true for the method specified in connection with FIGS. 4A to 4C.

In FIGS. 4A and 4B, a glass material 6, e.g., a glass wafer 6, may be formed using a pressing tool 43. An obtained formed glass wafer 6 may include an arbitrary number of recesses 45a and 45b at positions into which semiconductor devices may be placed later on. For example, the pressing tool 43 may be pressed against the glass wafer 6 and/or the glass wafer 6 may be pressed against the pressing tool 43 (see arrows in FIG. 4A) such that elevations 44a and 44b of the pressing tool 43 may form recesses 45a and 45b in the glass wafer 6. After the recesses 45a and 45b have been formed, the pressing tool 43 may be removed (see arrows in FIG. 4B). It is noted that any appropriate pressing technique may be employed for forming the recesses 45a and 45b. For example, a glass molding process or a precision glass molding process may be used for this purpose. However, it is understood that other appropriate techniques may be used for forming the recesses 45a and 45b. For example, one or more of the following techniques may be employed: dry etching, wet etching, milling, cutting, punching, laser ablation, etc. It is further understood that for performing any of such techniques, the glass wafer 6 may be heated to a temperature which is greater than the glass transition temperature of the glass material 6.

In FIG. 4C, semiconductor devices 1a and 1b may be placed into the recesses 45a and 45b, respectively. For example, the semiconductor devices 1a and 1b may be manufactured as specified in connection with FIGS. 3A and 3B. The semiconductor devices 1a and 1b are not necessarily fully embedded in the glass wafer 6 such that they at least partly protrude from the glass material 6. A massive tool 46 may be pressed against the glass wafer 6 and/or the glass wafer 6 may be pressed against the massive tool 46 such that the semiconductor devices 1a and 1b are pushed into the glass wafer 6. Before pushing the semiconductor devices 1a and 1b into the glass wafer 6, the glass material 6 may be heated to a temperature which is greater than the glass transition temperature of the glass material 6. Note that it may also be possible to not only heat the glass material 6, but also additional components, in particular the complete arrangement or stack. Such heating may result in a rubber-like state of the glass material 6 so that less pressure may be required to push the semiconductor devices 1a and 1b into the glass wafer 6. In particular, the massive tool 46 and the glass wafer 6 may be pressed against each other until a main surface 47 of the massive tool 46 and a main surface 48 of the glass wafer 6 are arranged in a common plane. In this case, side walls of the semiconductor devices 1a and 1b may be completely covered by the glass material 6. The massive tool 46 may then be removed after a certain cooling phase that may be necessary, and the glass material 6 may be cooled to a temperature which is smaller than the glass transition temperature of the glass material 6.

After the semiconductor devices 1a and 1b have been embedded into the glass wafer 6, an arrangement similar to FIG. 3H may be provided. In the following, one or more of the method steps specified in connection with FIGS. 3I to 3V may be performed. As a result, a device may be provided which is similar to the device 300 shown in FIG. 3V.

FIG. 5 schematically illustrates a cross-sectional view of an inner structure 500 of a device. An inner redistribution layer may be arranged in the semiconductor device 500. The redistribution layer may include a metallization 50 which may contain multiple stacked metal layers 51.1 to 51.$n$, wherein, for the sake of simplicity, only two of the metal layers 51.1 to 51.$n$ are illustrated. Spaces between the metal layers 51.1 to 51.$n$ may be filled with an organic and/or inorganic dielectric material 52, for example a polymer, e.g., polynorbornene, parylene, photoresist material, imide, epoxy, duroplast, silicone, silicon nitride, silicon oxide or an inorganic, ceramic-like material, such as silicone-carbon compounds. The metal layers 51.1 to 51.$n$ may be connected to each other via through connections 53 substantially arranged perpendicular to the metal layers 51.1 to 51.$n$. The lowest metal layer 51.1 may be connected to conductive components 54 of integrated circuits included in the device. For example, a conductive component 54 may be configured to provide an electrical coupling to a doped region of an active electronic component or to a doped region of a passive electronic component. The conductive components 54 may be isolated from other regions by means of a field oxide 55. As can be seen from FIG. 5, the first metallization 50 may be configured to provide a chip-internal redistribution between components of integrated circuits (or active components or passive components) and a contact element 5 arranged on a surface of the device. Note that the metal layers 51.1 to 51.$n$ may also extend in a direction perpendicular to the plane of the cross-section of FIG. 5.

The device of FIG. 5 may further include a passivation layer 56 which may be made of or may include at least one of silicon nitride, silicon oxide, $Al_2O_3$, aC:H, DLC, and a polymer. The passivation layer 56 may cover a top surface of the device. The passivation layer 56 may be opened at the location of the contact element 5. In FIG. 5, the contact element 5 extends over the surface of the passivation layer 56. Alternatively, a thickness of the passivation layer 56 may be increased such that the side surfaces of the contact element 5 may be covered by the passivation layer 56. In this case, the upper surfaces of the contact element 5 and the passivation layer 56 may be (substantially) arranged in a common plane. A barrier layer 57 which may be made of or may include one of titanium or tungsten (W) may be arranged between the first metallization 50 and the contact element 5 in order to provide an electrical connection between these components.

Figure 6:
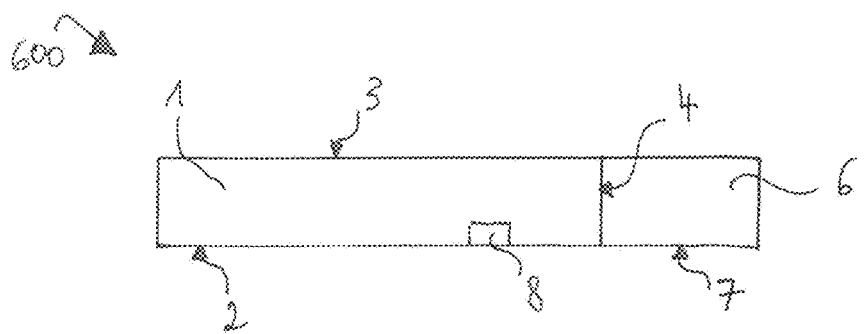
FIG. 6 schematically illustrates a cross-sectional view of a device 600 in accordance with the disclosure.

FIG. 6 schematically illustrates a cross-sectional view of a device 600. The device 600 includes a semiconductor material 1 including a first main surface 2, an opposite surface 3 opposite to the first main surface 2 and a side surface 4 extending from the first main surface 2 to the opposite surface 3. The device 600 further includes a doped region 8 arranged in the semiconductor material 1 and a glass material 6 having a second main surface 7. The glass material 6 contacts the side surface 4 of the semiconductor material 1. Further, the doped region 8 of the semiconductor material 1 and the second main surface 7 of the glass material 6 are arranged in a common plane.

Figure 7A:
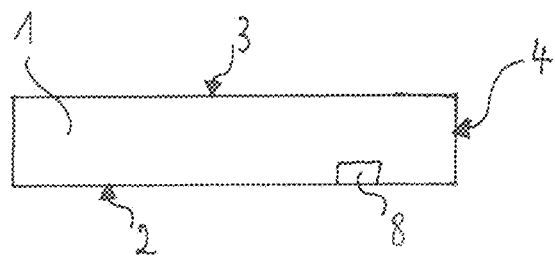
FIGS. 7A and 7B schematically illustrates a cross-sectional view of a method for manufacturing a semiconductor device 700 in accordance with the disclosure.
Figure 7B:
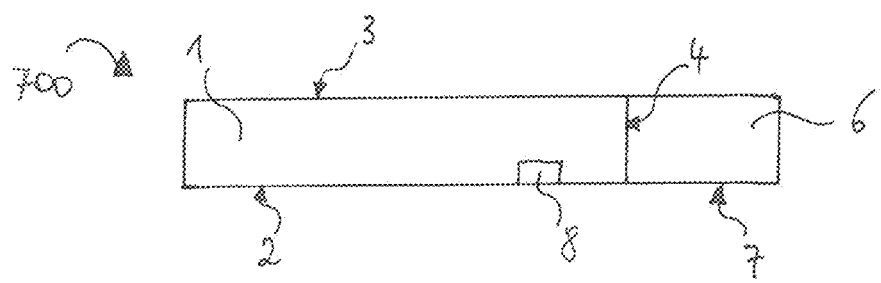

FIGS. 7A and 7B schematically illustrate a method for manufacturing a device 700. A cross section of the device 700 obtained by the method is illustrated in FIG. 7B. The device 700 may be similar to the device 600 of FIG. 6. In a first step (see FIG. 7A), a semiconductor material 1 is provided. The semiconductor material 1 includes a first main surface 2, an opposite surface 3 opposite to the first main surface 2 and a side surface 4 extending from the first main surface 2 to the opposite surface 3. In addition, the semiconductor material 1 includes a doped region 8. In a second step (see FIG. 7B), a glass material 6 including a second main surface 7 is applied. The glass material 6 is applied such that the glass material 6 contacts the side surface 4 of the semiconductor material 1 and such that the doped region 8 of the semiconductor material 1 and the second main surface 7 of the glass material 6 are arranged in a common plane.

FIGS. 8A to 8F schematically illustrate a method for manufacturing a device. The described method may have similar steps as described in connection with FIGS. 3A to 3V. All comments made in this regard may thus also hold true for the method described in the following. The method of FIGS. 8A to 8F may be seen as an implementation of the method of FIGS. 7A and 7B. Hence, details of the method described in the following may be likewise applied to the method of FIGS. 7A and 7B.

In FIG. 8A, a semiconductor wafer 20 including doped regions 8 is provided. The doped regions 8 may be part of semiconductor components (see exemplary lines A and A') which may become a part of semiconductors devices 1a and 1b that are to be manufactured from the semiconductor wafer 20. The semiconductor components may be passive electronic components, active electronic components, integrated circuits, etc. It is understood that the semiconductor wafer 20 may include an arbitrary number of doped regions 8, semiconductor components and semiconductor devices that are to be produced.

In FIG. 8B, the semiconductor wafer 20 is separated (see dashed line) into a plurality of parts 1a and 1b that may become semiconductor devices later on, respectively.

In FIG. 8C, a first separated part 1a and a second separated part 1b as well as possibly further parts (not shown) may be placed over a carrier 21. For example, the parts 1a and 1b of FIG. 8B may be used in this connection. The surfaces of the parts 1a and 1b including the doped regions 8 may be referred to as active main surfaces 23. The parts 1a and 1b may be arranged over the carrier 21 with their active main surfaces 23 facing the carrier 21. The parts 1a and 1b may be fixed on an mechanical fixing layer 22. For attaching the parts 1a and 1b to the carrier 21, other kinds of attaching materials may be used as well. The parts 1a and 1b and the possibly further parts (not shown) may e.g., be arranged in an array.

The parts 1a and 1b may be relocated on the carrier 21 in larger spacing as they have been arranged in the semiconductor wafer 20 of FIG. 8A. It is noted that the parts 1a and 1b may have been manufactured on the same semiconductor wafer, but may also alternatively have been manufactured on different semiconductor wafers. In addition, the parts 1a and 1b may be physically identical, but may also contain doped regions arranged differently. Before the parts 1a and 1b may be placed on the carrier 21, they may be thinned, for example by grinding their backsides, down to a thickness in the range from about 30 to about 700 µm (micrometers) and more particular in a range from about 40 to about 300 µm (micrometers). An even more particular thickness has a value of about 250 µm.

In FIG. 8D, a glass material 6 may be applied after the parts 1a and 1b have been mounted on the carrier 21. An application of the glass material 6 may be performed similar to FIG. 3F. It is noted that the parts 1a and 1b may also be embedded in the glass material 6 according to the method steps specified in connection with FIGS. 4A to 4C.

In FIG. 8E, the parts 1a and 1b embedded in the glass material 6 may be released from the carrier 21, and the mechanical fixing layer 22 (if used) may be peeled from the parts 1a and 1b. After such release, the semiconductor surface 23 with the doped regions 8 as well as the bottom surface of the glass material 6 may form a common planar surface 26, i.e., may be arranged in a common plane.

In FIG. 8F, inner redistribution layers 500a and 500b including contact elements 8 may be applied to parts 1a and 1b, respectively. Each of the inner redistribution layers 500a and 500b may be similar to the redistribution layer illustrated and described in connection with FIG. 5. It is noted that any appropriate approach may be employed to fabricate the inner redistribution layer 500.

After the inner redistribution layer 500 has been applied, an arrangement similar to FIG. 3H may be provided. In the following, one or more of the method steps described in connection with FIGS. 3I to 3V may be performed. As a result, a device may be obtained which is similar to the device 300 of FIG. 3V.

Figure 9:
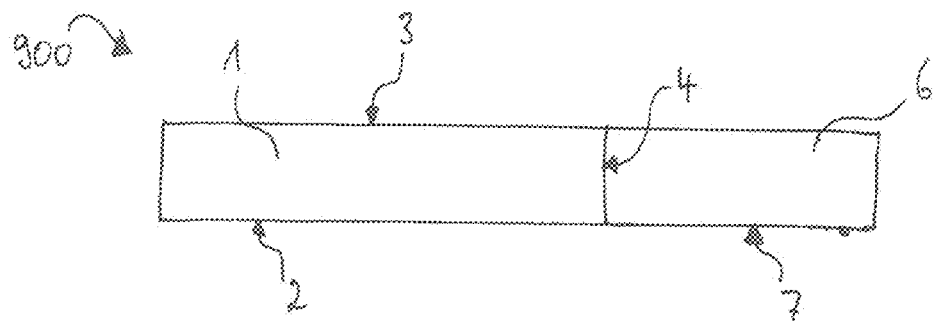
FIG. 9 schematically illustrates a cross-sectional view of a device 900 in accordance with the disclosure.

FIG. 9 schematically illustrates a cross-sectional view of a device 900. The device 900 includes a semiconductor material 1 including an active surface 2, an opposite surface 3 opposite to the active surface 2 and a side surface 4 extending from the active surface 2 to the opposite surface 3. The device 900 further includes a glass material 6 having a main surface 7. The glass material 6 contacts the side surface 4 of the semiconductor material 1. In addition, the active surface 2 of the semiconductor material 1 and the main surface 7 of the glass material 6 are arranged in a common plane.

The active surface 2 of the semiconductor material 1 may e.g., include (or may be defined) by an electrical contact element (not shown). In this case, the device 900 may be fabricated or processed by a method similar to the method described in connection with FIGS. 3A to 3V.

The active surface 2 of the semiconductor material 1 may e.g., include (or may be defined) by doped regions (not shown) of the semiconductor material 1. In this case, the device 900 may be fabricated or processed by a method similar to the method described in connection with FIGS. 8A to 8F.

Figure 10:
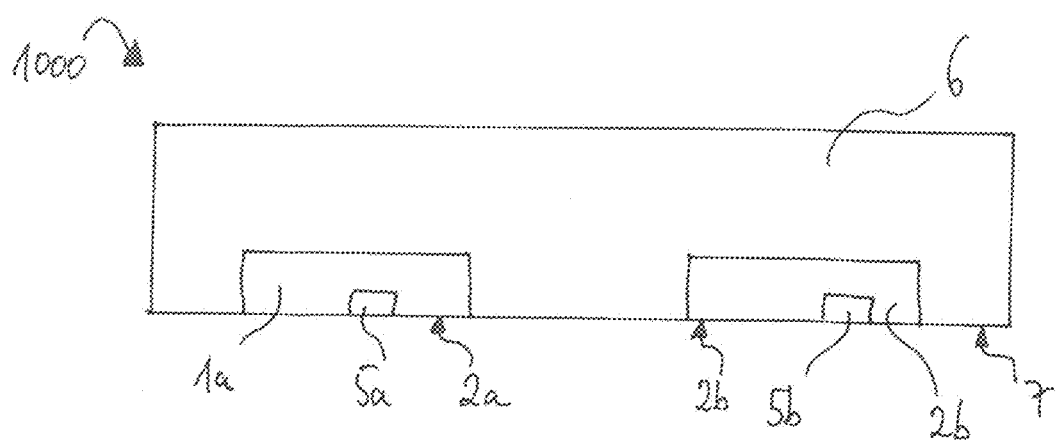
FIG. 10 schematically illustrates a cross-sectional view of a device 1000 in accordance with the disclosure.

FIG. 10 schematically illustrates a cross-sectional view of a device 1000. The device 1000 includes at least two semiconductor chips 1a and 1b as well as a glass material 6 embedding the at least two semiconductor chips 1a and 1b.

Each of the at least two semiconductor chips 1a and 1b includes a first main surface 2a and 2b including electrical contact elements 5a and 5b, respectively. The glass material 6 includes a second main surface 7. The first main surfaces 2a and 2b of the at least two semiconductor chips 1a and 1b and the second main surface 7 of the glass material 6 are arranged in a common plane. For example, the device 1000 may e.g., be similar to the device of FIG. 3H.

While a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Furthermore, it should be understood that aspects of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific aspects shown and described without departing from the scope of the present invention. This application is intended to cover any adaptations or variations of the specific aspects discussed herein. Therefore, it is intended that this invention be limited only by the claims and the equivalents thereof.

What is claimed is:

1. A device comprising:
a semiconductor material comprising a first main surface, an opposite surface opposite to the first main surface, a side surface extending from the first main surface to the opposite surface, and a functional area configured to operate in a radio frequency range;
a first electrical contact element arranged on the first main surface of the semiconductor material;
a glass material comprising a second main surface, wherein the glass material contacts the side surface of the semiconductor material and wherein the first main surface of the semiconductor material and the second main surface of the glass material are arranged in a common plane; and
a redistribution layer comprising at least one metal layer arranged over the first main surface of the semiconductor material and over the second main surface of the glass material, the redistribution layer electrically coupled to the first electrical contact element, at least one dielectric layer arranged over the first main surface of the semiconductor material and over the second main surface of the glass material, and a passive electronic component arranged over the second main surface of the glass material, wherein when viewed in a direction perpendicular to the common plane an outline of the passive electronic component is arranged completely outside of an outline of the semiconductor material and completely inside of an outline of the glass material, and wherein the glass material comprises a Low Temperature Co-Fired Ceramic.

2. The device of claim 1, wherein the glass material completely covers the side surface of the semiconductor material.

3. The device of claim 1, wherein the glass material contacts the opposite surface of the semiconductor material.

4. The device of claim 1, wherein the opposite surface of the semiconductor material is exposed from the glass material.

5. The device of claim 1, further comprising an active electronic component disposed in the semiconductor material.

6. The device of claim 1, wherein the passive electronic component is formed from the at least one metal layer.

7. The device of claim 1, further comprising a second electrical contact element arranged over the at least one metal layer, wherein the at least one metal layer provides an electrical coupling between the first electrical contact element and the second electrical contact element.

8. The device of claim 1, wherein the glass material comprises an inorganic material.

9. The device of claim 1, wherein the glass material comprises at least one of photosensitive glass, floating glass, soda-lime glass, borosilicate glass, alkali-free glass, low-Tg glass, silica.

10. The device of claim 1, wherein the passive electronic component comprises at least one of a resistor, a capacitor, an inductive component.

11. The device of claim 1, wherein the glass material comprises at least 50 percent of an inorganic material.

12. The device of claim 1, wherein the glass material is completely made of an inorganic material.

13. The device of claim 1, wherein the first main surface of the semiconductor material, the second main surface of the glass material, and a surface of the first electrical contact element are arranged in the common plane.

14. The device of claim 1, wherein the radio frequency range varies from 100 MHz to 500 GHz.

15. A device comprising:
a semiconductor material comprising a first main surface, an opposite surface opposite to the first main surface a side surface extending from the first main surface to the opposite surface, and a functional area configured to operate in a radio frequency;
a doped region arranged in the semiconductor material;
a glass material comprising a second main surface, wherein the glass material contacts the side surface of the semiconductor material and wherein the doped region of the semiconductor material and the second main surface of the glass material are arranged in a common plane; and
a redistribution layer comprising at least one first metal layer arranged over the first main surface of the semiconductor material and over the second main surface of the glass material and providing an electrical coupling to an electrical contact element arranged over the doped region, at least one dielectric layer arranged over the first main surface of the semiconductor material and over the second main surface of the glass material, and a passive electronic component arranged over the second main surface of the glass material, wherein when viewed in a direction perpendicular to the common plane an outline of the passive electronic component is arranged completely outside of an outline of the semiconductor material and completely inside of an outline of the glass material, and wherein the glass material comprises a Low Temperature Co-Fired Ceramic.

16. The device of claim 15, further comprising a second metal layer providing an electrical coupling between the electrical contact element and the doped region.

17. The device of claim 16, further comprising a passivation layer arranged over the second metal layer.

18. The device of claim 15, wherein the passive electronic component is formed from the at least one first metal layer.

19. A device comprising:
- a semiconductor material comprising an active surface, an opposite surface opposite to the active surface, a side surface extending from the active surface to the opposite surface, and a functional area configured to operate in a radio frequency range;
- a glass material comprising a main surface wherein the glass material contacts the side surface of the semiconductor material and wherein the active surface of the semiconductor material and the main surface of the glass material are arranged in a common plane; and
- a redistribution layer comprising at least one metal layer arranged over the active surface of the semiconductor material and over the main surface of the glass material, the redistribution layer electrically coupled to a first electrical contact element, at least one dielectric layer arranged over the active surface of the semiconductor material and over the main surface of the glass material, and a passive electronic component arranged over the main surface of the glass material, wherein when viewed in a direction perpendicular to the common plane an outline of the passive electronic component is arranged completely outside of an outline of the semiconductor material and completely inside of an outline of the glass material and wherein the glass material comprises a Low Temperature Co-Fired Ceramic.

20. The device of claim 19, wherein the active surface comprises a doped region of the semiconductor material.

21. A device comprising:
- at least two semiconductor chips;
- a glass material embedding the at least two semiconductor chips, wherein each of the at least two semiconductor chips comprises a first main surface comprising an electrical contact element and a functional area operating in a radio frequency range, wherein the glass material comprises a second main surface, and wherein the first main surfaces of the at least two semiconductor chips and the second main surface of the glass material are arranged in a common plane; and
- a redistribution layer comprising at least one metal layer arranged over the first main surfaces of the semiconductor chips and over the second main surface of the glass material, the redistribution layer electrically coupled to first electrical contact elements, at least one dielectric layer arranged over the first main surfaces of the semiconductor chips and over the second main surface of the glass material, and a passive electronic component arranged over the second main surface of the glass material, wherein when viewed in a direction perpendicular to the common plane an outline of the passive electronic component is arranged completely outside of an outline of a semiconductor material and completely inside of an outline of the glass material, and wherein the glass material comprises a Low Temperature Co-Fired Ceramic.

* * * * *